US009052766B2

(12) United States Patent
Dunphy et al.

(10) Patent No.: US 9,052,766 B2
(45) Date of Patent: Jun. 9, 2015

(54) MESH SENSOR DESIGN FOR REDUCED VISIBILITY IN TOUCH SCREEN DEVICES

(71) Applicant: Synaptics Incorporated, Santa Clara, CA (US)

(72) Inventors: James Dunphy, San Jose, CA (US); Bob Lee Mackey, Santa Clara, CA (US); Joseph Kurth Reynolds, Alviso, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 248 days.

(21) Appl. No.: 13/766,864

(22) Filed: Feb. 14, 2013

(65) Prior Publication Data
US 2014/0225839 A1    Aug. 14, 2014

(51) Int. Cl.
*G06F 3/041* (2006.01)
*H01H 11/00* (2006.01)
*G06F 3/044* (2006.01)
*H05K 1/02* (2006.01)

(52) U.S. Cl.
CPC ......... *G06F 3/0412* (2013.01); *Y10T 29/49105* (2015.01); *G06F 3/044* (2013.01); *H05K 2201/09681* (2013.01); *H05K 1/0296* (2013.01)

(58) Field of Classification Search
CPC .......... G06F 2203/04112; G06F 3/041; G06F 3/0412; G06F 3/044; G06F 3/047; G06F 17/50; H05K 3/0011
See application file for complete search history.

(56) References Cited

U.S. PATENT DOCUMENTS

| 5,394,003 | A | 2/1995 | Bales et al. |
| 6,078,315 | A | 6/2000 | Huang |
| 6,593,917 | B2 | 7/2003 | Toda |
| 6,621,341 | B1 | 9/2003 | Shifrin |
| 6,741,237 | B1 | 5/2004 | Benard et al. |
| 7,187,369 | B1 | 3/2007 | Kanbara et al. |
| 7,265,746 | B2 | 9/2007 | Knowles et al. |
| 2008/0074182 | A1 | 3/2008 | Hoelzle et al. |
| 2009/0219257 | A1* | 9/2009 | Frey et al. ............. 345/173 |
| 2009/0219258 | A1 | 9/2009 | Geaghan et al. |

(Continued)

FOREIGN PATENT DOCUMENTS

KR    20120018046 A    2/2012

OTHER PUBLICATIONS

PCT international search report and written opinion of PCT/US20913/071705 dated Mar. 17, 2014.

*Primary Examiner* — Dwayne Bost
*Assistant Examiner* — Ivelisse Martinez Quiles
(74) *Attorney, Agent, or Firm* — Patterson + Sheridan, LLP

(57) ABSTRACT

An input device having a plurality of low-visibility sensor electrodes and method for fabricating the same are provided. In one embodiment, an input device includes a plurality of sensor electrodes disposed over a display device. A first sensor electrode of the plurality of sensor electrodes includes a conductive mesh having a first periodicity defined by intersections of conductive traces forming the mesh. A terminal portion of one of the conductive traces terminating at an edge of the first sensor electrode has an orientation that is different than an orientation of a corresponding portion of the mesh defining the first periodicity. An end of the terminal portion proximate the edge laying over a subpixel has the same color as a subpixel of the display device which the end would lay over if the end had the same orientation as the corresponding portion of the mesh defining the first periodicity.

22 Claims, 16 Drawing Sheets

(56) References Cited

U.S. PATENT DOCUMENTS

| | | |
|---|---|---|
| 2009/0273577 A1 | 11/2009 | Chen et al. |
| 2011/0102361 A1 | 5/2011 | Philipp |
| 2011/0148781 A1* | 6/2011 | Chen et al. ................ 345/173 |
| 2011/0210935 A1* | 9/2011 | Chuang ...................... 345/174 |
| 2011/0291966 A1 | 12/2011 | Takao et al. |
| 2011/0310033 A1* | 12/2011 | Liu et al. ................... 345/173 |
| 2011/0310037 A1 | 12/2011 | Moran et al. |
| 2012/0081324 A1 | 4/2012 | Philipp |
| 2012/0242606 A1 | 9/2012 | Mackey |
| 2013/0082970 A1* | 4/2013 | Frey et al. .................. 345/173 |
| 2013/0155001 A1* | 6/2013 | Yilmaz et al. .............. 345/174 |
| 2013/0278513 A1* | 10/2013 | Jang ............................ 345/173 |
| 2013/0293096 A1* | 11/2013 | Kang et al. ................. 313/511 |
| 2013/0342472 A1* | 12/2013 | Guard ......................... 345/173 |
| 2014/0002369 A1* | 1/2014 | Guard ......................... 345/173 |
| 2014/0049485 A1* | 2/2014 | Oh et al. ..................... 345/173 |
| 2014/0049504 A1* | 2/2014 | Cok ............................ 345/174 |
| 2014/0055403 A1* | 2/2014 | Cok ............................ 345/174 |

* cited by examiner

MESH SENSOR DESIGN FOR REDUCED VISIBILITY IN TOUCH SCREEN DEVICES

FIELD OF INVENTION

Embodiments of the invention generally relate to an input device having a plurality of low-visibility sensor electrodes and method sensing an input object using the same.

BACKGROUND

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computer systems (such as touch screens integrated in cellular phones).

Some proximity sensor devices proximity sensor devices utilize microscopic wiring patterns made from opaque conductive materials to form conductive sensor elements. When used over a display of the touch screen, these conductive traces or wires can block some of the pixels or sub-pixels in the display. Certain patterns interfere with the display more than others. For example, if the sensor periodicity is close to the display periodicity, a moiré pattern may be visible when the display is illuminated. Because the eye is more sensitive to some pattern sizes than others, the moiré pattern has a different appearance depending on its size. In the size range of typical displays, small features are less visible. Because of this, fabricators have conventionally attempted to minimize the moiré pattern by reducing the size and width of each conductive trace. Cost effective processing precludes making the conductive traces so small that they cannot be seen under any condition, rendering simple size reduction as an ineffective solution.

Therefore, there is a need for an improved an input device having a plurality of low-visibility sensor electrodes for sensing an input object relative to a sensing region of the input device.

SUMMARY OF INVENTION

An input device having a plurality of low-visibility sensor electrodes and method for using the same are provided. In one embodiment, an input device includes a plurality of sensor electrodes disposed over a display device having an array of pixels. Each pixel including at least a first subpixel having a first color and a second subpixel having a second color that is different than the first color. The plurality of sensor electrodes are configured to sense objects in a sensing region of the input device. At least a first sensor electrode of the plurality of sensor electrodes further includes plurality of spaced apart conductive traces forming a conductive mesh having a first periodicity defined by intersections of the conductive traces forming the mesh. A terminal portion of one of the conductive traces terminating at an edge of the first sensor electrode has an orientation that is different than an orientation of a corresponding portion of the mesh defining the first periodicity. An end of the terminal portion of the conductive trace proximate the edge of the first sensor electrode laying over a subpixel has the same color as a subpixel which the end would lay over if the end had the same orientation as the corresponding portion of the mesh defining the first periodicity.

In another embodiment, an input device is provided that includes a display device having an array of pixels and a plurality of sensor electrodes disposed over the display device. The sensor electrodes are configured to sense objects in a sensing region of the input device. The plurality of sensor electrodes further include a first sensor electrode comprising a plurality of spaced apart conductive traces forming a conductive mesh, a second sensor electrode comprising a plurality of spaced apart conductive traces forming a conductive mesh, a first unit area having a visually resolvable plan area defined within the first sensor electrode, and a second unit area having a visually resolvable plan area defined partially within the first sensor electrode and partially within the second sensor electrode. A first blockage area defined within the first unit area is substantially equal to a second blockage area defined within the second unit area.

In yet another embodiment, a method for making a sensor device is provided that includes receiving display information and generating mesh sensor fabrication instructions for creating a trace pattern for a plurality of sensor electrodes, the trace pattern having reduce visibility. For example in one embodiment, the trace pattern may include first unit area having a visually resolvable plan area defined within a first sensor electrode of the plurality of sensor electrodes, and a second unit area having a visually resolvable plan area defined partially within the first sensor electrode and partially within a second sensor electrode of the plurality of sensor electrodes, wherein a first blockage area defined within the first unit area is substantially equal to a second blockage area defined within the second unit area.

In another embodiment, the trace pattern may include a conductive mesh having a first periodicity defined by intersections of the traces forming the mesh, a terminal portion of one of the conductive traces terminating at an edge of the a sensor electrode of the plurality of sensor electrodes, the sensor electrode having an orientation that is different than an orientation of a corresponding portion of the conductive mesh, and wherein an end of a terminal portion of the conductive trace proximate an edge of the sensor electrode laying over a subpixel having the same color as a subpixel which the end would lay over if the end had the same orientation as a corresponding portion of the conductive mesh at an interior of the sensor electrode.

BRIEF DESCRIPTION OF DRAWINGS

So that the manner in which the above recited features can be understood in detail, a more particular description, briefly summarized above, may be had by reference to embodiments, some of which are illustrated in the appended drawings. It is to be noted, however, that the appended drawings illustrate only embodiments of the invention and are therefore not to be considered limiting of its scope, for the invention may admit to other equally effective embodiments.

DESCRIPTION OF EMBODIMENTS

The following Description of Embodiments is merely provided by way of example and not of limitation. Furthermore, there is no intention to be bound by any expressed or implied theory presented in the preceding technical field, background, brief summary or the following detailed description. Various embodiments of the present invention provide input devices and methods that facilitate improved usability of a touch screen device.

In various embodiments, an input device is formed from conductive traces (i.e., micro-traces) arranged at an angle and periodicity such that the traces are substantially invisible, thus allowing larger assemblies of small traces to form sensor elements that do not substantially diminish the quality of light transmission through the input device. Advantageously, the low-visibility traces can be utilized to form sensor elements in virtually any arbitrary shape, size or orientation, thereby allowing the design of the sensor elements to focus on device performance instead of trying to minimize disruption of light transmission or other undesirable visual effects.

Figure 1:
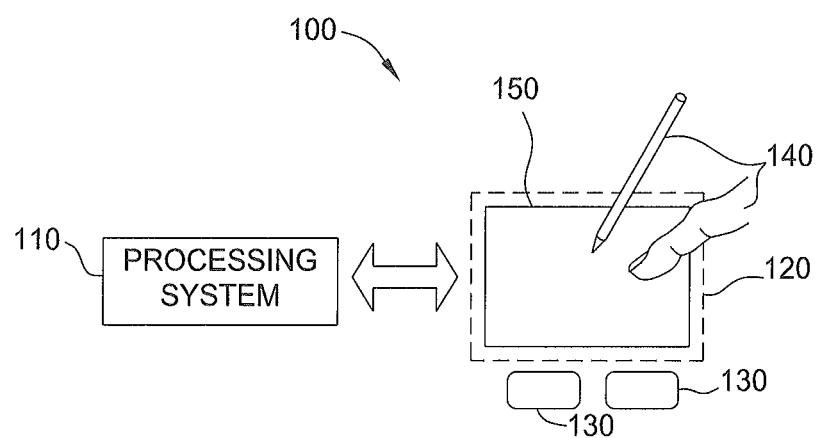
FIG. 1 is a schematic block diagram of an exemplary input device having a sensor device, in accordance with embodiments of the invention.

FIG. 1 is a schematic block diagram of an exemplary input device 100, in accordance with embodiments of the invention. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such a desktop computers, laptop computers, notebook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include I²C, SPI, PS/2, Universal Serial Bus (USB), Bluetooth, RF, and IRDA.

In FIG. 1, the input device 100 is shown as a proximity sensor device (also often referred to as a "touchpad" or a "touch sensor device") and includes a sensor device 150 having sensing elements configured to sense input provided by one or more input objects 140 in a sensing region 120. Example input objects include fingers and styli, as shown in FIG. 1.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be one the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g., a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements (i.e., sensor electrodes of the sensor device 150) for detecting user input. As several non-limiting examples, the input device 100 may use ultrasonic, capacitive, elastive, resistive, inductive, surface acoustic wave, and/or optical techniques to provide one or more resulting signals which include positive and negative polarities, the one or more resulting signals including effects indicative of the input object relative to the sensing region.

Some implementations are configured to provide images that span one, two, three or higher dimensional spaces. Some implementations are configured to provide projections of input along particular axes or planes.

In some resistive implementations of the input device 100, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 100, one or more sensing elements pick up loop currents induced by a resonating coil or pair of coils. Some combination of the magnitude, phase, and frequency of the currents may then be used to determine positional information.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g. system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g. other electromagnetic signals). Sensor electrodes may be dedicated transmitters or receivers, or may be configured to both transmit and receive.

In FIG. 1, the processing system (or "processor") 110 is shown as a part or subsystem of the input device 100. The processing system 110 is configured to operate the hardware of the input device 100 to detect input in the sensing region 120 utilizing resulting signals provided to the processing system 110 from the sensor device 150. The processing system 110 comprises parts of or all of one or more integrated circuits (ICs) and/or other circuitry components; in some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g., to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the sensor device 150 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes of the sensor device 150. As another example, the processing system 110 may perform filtering or other signal conditioning. As yet another example, the processing system 110 may subtract or otherwise account of a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. These input components may be part of the sensor device 150. Conversely, in some embodiments, the input device 100 may be implemented with no other input components.

In some embodiments, the input device 100 comprises a touch screen interface, and the sensing region 120 overlaps at least part of an active area of a display screen that is part of a display device 160 shown in FIG. 2 and described further below. For example, the sensor device 150 of the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing storage media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable storage media include various discs, memory sticks, memory cards, memory modules, and the like. Electronically readable storage media may be based on flash, optical, magnetic, holographic, or any other storage technology.

Figure 2:
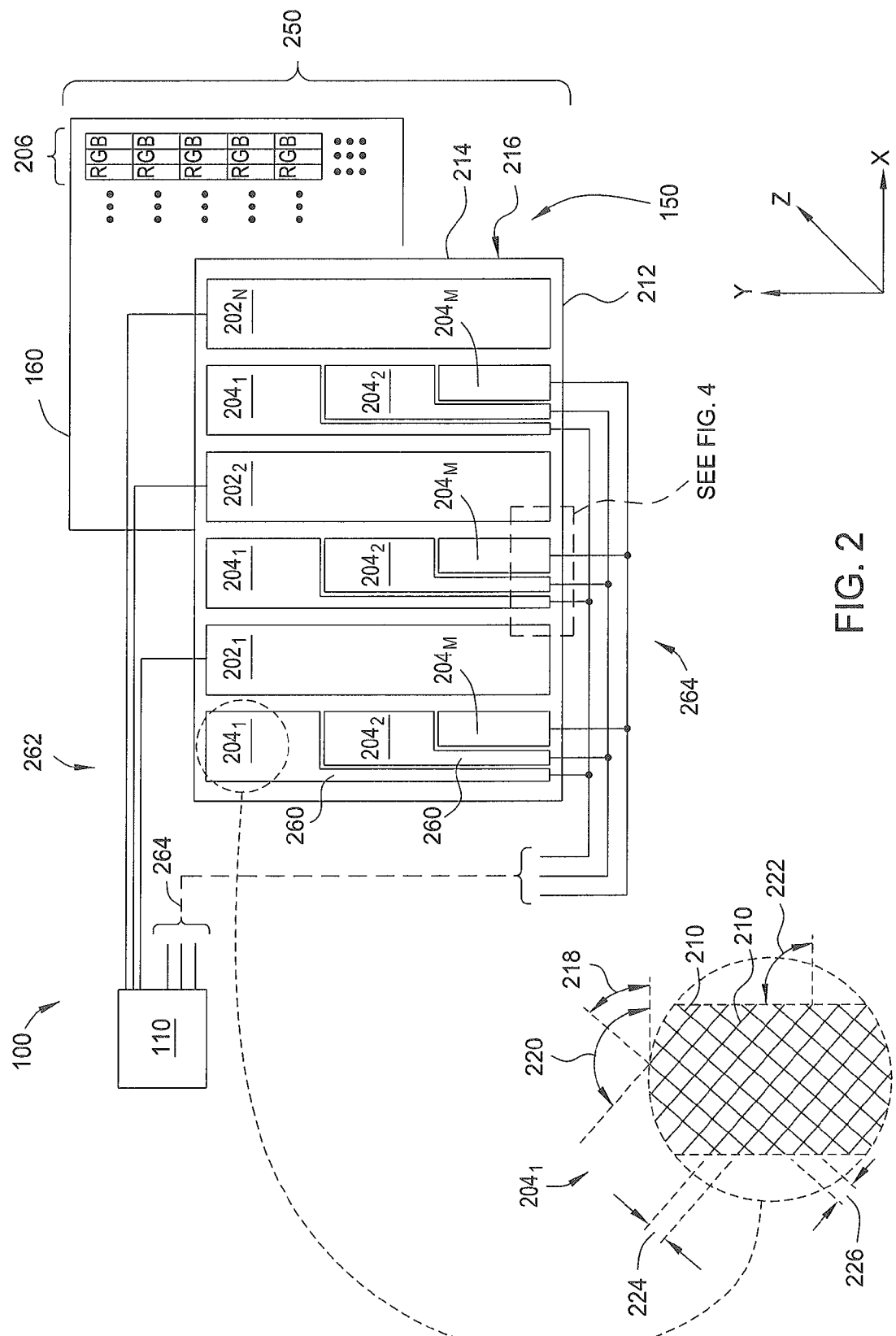
FIG. 2 is an exploded schematic of one embodiment of the sensor device of FIG. 1 disposed over a display device, including an enlargement of a portion of a sensor illustrating traces comprising the sensor.

FIG. 2 is an exploded schematic of one embodiment of the sensor device 150 disposed over a display device 160. As discussed above, a portion or all of the sensor device 150 may optionally be incorporated into the display device 160. Together, the input device 100 having the sensor device 150 and the display device 160 may be part of an electronic system 250.

The display device 160 may have monochromatic pixels, each formed from single subpixels, or multi-colored pixels, each formed from multiple subpixels. Three or four subpixels per color pixel are common, with color pixels formed from red-green-blue subpixels, red-green-blue-white subpixels, red-green-blue-yellow subpixels, or some other combination of differently-colored subpixels. In embodiments where the display device 160 includes multiple subpixels per pixel, the display device 160 typically has a pixel pitch along the directions that the display device spans. For example, square or rectangular display screens typically has "X" and "Y" pixel pitches. These pitches may be equal (resulting in square pixels) or not equal. In the embodiment depicted in FIG. 2, the display device 160 includes an array of square pixels 206 comprised of red (R), green (G), and blue (B) subpixels, but in other embodiments, other subpixels and subpixels groupings may be used.

The sensor device 150 includes a plurality of sensor elements, for example, a sensor electrode pattern, configured to sense the presence of (or lack thereof) input objects 140 in the sensing region 120 adjacent the sensor device 150. For clarity of illustration and description, FIG. 2 shows a pattern of simple rectangles, and does not show various components. In various embodiments, the sensor electrode pattern comprises a plurality of first sensor electrodes $202_1$, $202_2$, ... $202_n$ (collectively referred to as first sensor electrodes 202), and a plurality of second sensor electrodes $204_1$, $204_2$, ... $204_m$ (collectively referred to as second sensor electrodes 204) disposed adjacent the plurality of first sensor electrodes 202, wherein N and M are positive integers representative of the last electrode in the array, and wherein N may, or may not, equal M. In the embodiment depicted in FIG. 2, all of the second sensor electrodes 204 designed by the same subscript are linearly aligned to form M parallel rows, three of which are shown. Likewise, the first sensor electrodes 202 are linear and parallel to each other, and oriented perpendicular to the rows of second sensor electrodes $204_{1-M}$. It is also contemplated that the sensor electrodes 202, 204 may have different orientations.

In the embodiment depicted in FIG. 1, the sensor electrodes 202, 204 are shown disposed on a single substrate 216. It is contemplated that the sensor electrodes 202, 204 may be disposed on the same or opposite sides of the substrate 216. It is also contemplated that the first sensor electrodes 202 may be disposed second sensor electrodes 204 different substrates.

The first sensor electrodes 202 and second sensor electrodes 204 are coupled to the processing system 110 by conductive routing lines 262, 264, wherein at least a portion of at least one of the conductive routing lines 262, 264 is disposed on the substrate 216 on which the electrodes 202, 204 are formed. The conductive routing lines 262, 264 may be formed from ITO, aluminum, silver and copper, among other suitable materials. The conductive routing lines 262, 264 may be fabricated from opaque or non-opaque materials. In the embodiment depicted in FIG. 2, at least a portion 260 of the conductive routing lines 262 is routed on the substrate 216 between the electrodes 202, 204, and such portion 260 of the conductive routing lines 262 may be configured as discussed below with reference to the construction of the electrodes 202, 204.

In a transcapacitive configuration, the first sensor electrodes 202 and second sensor electrodes 204 may be configured to sense the presence of (or lack thereof) input objects 140 in the sensing region 120 adjacent the sensor device 150 by driving a signal onto one of the sensor electrodes (i.e., transmitter electrode), while at least one of the other sensor electrodes is configured as a receiver electrode. The capacitive coupling between the transmitter sensor electrodes and receiver sensor electrodes change with the proximity and motion of input objects (140 shown in FIG. 1) in the sensing region 120 associated with the first and second sensor electrodes 202, 204. By monitoring the capacitive coupling between the transmitter sensor electrodes and receiver sensor electrodes, the location and/or motion of the input object 140 may be determined.

Alternatively in an absolute sensing configuration, first sensor electrodes 202 and second sensor electrodes 204 may be configured to sense the presence of input objects 140 in the sensing region 120 adjacent the sensor device 150 based on changes in the capacitive coupling between sensor electrodes 202, 204 and an input object 140. For example, the sensor electrodes 202, 204 may be modulated with respect to a reference voltage (e.g. system ground), and by detecting the capacitive coupling between the sensor electrodes 202, 204 and input objects, the location and/or motion of the input object 140 may be determined. In other embodiments, other sensing methods may be used, including but not limited to, optical sensing, resistive sensing, acoustic wave sensing, ultrasonic sensing and the like.

In some touch screen embodiments, first sensor electrodes 202 comprise one or more common electrodes (e.g., "V-com electrode") used in updating the display of the display device 160. These common electrodes may be disposed on an appropriate display screen substrate of the display device 160. For example, the common electrodes may be disposed on the TFT glass in some display screens (e.g., In-Plane Switching (IPS) or Plane to Line Switching (PLS)), on the bottom of the color filter glass of some display screens (e.g., Patterned Vertical Alignment (PVA) or Multi-domain Vertical Alignment (MVA)), etc. In such embodiments, the common electrode can also be referred to as a "combination electrode", since it performs multiple functions. In various embodiments, each first sensor electrode 202 comprises one or more common electrodes. In other embodiments, at least two first sensor electrodes 202 may share at least one common electrode.

At least one of the sensor electrodes 202, 204 comprises one or more conductive traces having a diameter less than about 10 um. In the embodiment depicted in FIG. 2, a portion of the second sensor electrode $204_1$ is enlarged such that conductive traces 210 are shown. In various embodiments, the conductive traces 210 may be fabricated from a material sufficiently conductive enough to allow charging and discharging of the sensor electrodes 202, 204. Examples of materials suitable for fabricating the conductive traces 210 include ITO, aluminum, silver and copper, among others. The conductive traces 210 may be fabricated from opaque or non-opaque materials, and may be one of a metal mesh and/or thin metal wires. Suitably conductive carbon materials may also be utilized. Advantageously, using metallic materials for the conductive traces 210 provides much lower electrical resistance as compared to substantially transparent conductors, thereby improving device performance. Although the traces 210 are shown as being linear, the traces 210 may also be wavy, for example, sinusoidal, along its length.

In at least some embodiments, the traces 210 may be arranged in an orientation that is substantially invisible and/or produces an acceptable moiré pattern, the width of the traces 210 may be increased, thereby allowing simpler and more efficient processing. For example, the conductive traces 210 may be arranged with at least one of an angle and periodicity selected to render the traces substantially invisible. This allows a number of small traces 210 to be locally grouped to form larger sensor elements (such as the second sensor electrode $204_1$ and other electrodes illustrated in FIG. 2) in any arbitrary shape, size and orientation. In this manner, the second sensor electrode 204 (and/or similarly constructed first sensor electrode 202) may be linear, curved, circular, polygonal or other desirable geometric shape.

As mentioned above, the angle of individual traces 210 relative to the axes of the display device 160 will also affect the visibility of the traces 210. Not all of the traces 210 grouped to form a single sensor electrode need have the same angular orientation, as long as combined arrangement of the traces 210 will not detrimentally affect the visibility of an image displayed on the display device 160. Thus, in many embodiments, the traces 210 are predominantly orientated at angles selected to reduce the visibility of the moiré patterns that may result.

In the embodiment depicted in FIG. 2, the axes of pixels 206 comprising the display device 160 are aligned with the X and Y coordinate axes, as are lateral edges 212, 214 of the transparent substrate 216 on which the second sensor electrodes 204 of the sensor device 150 is disposed. Thus, primary angles 218, 220 of individual traces 210 thus may be referenced relative to one of the lateral edges, for example edge 212, which is aligned with the axis of the pixels 206. The angles 218, 220 of individual traces 210 in which the traces 210 may be rendered substantially invisible may be determined by a variety of methods. For example, one method to render the traces 210 substantially invisible is to rotate a physical embodiment of the sensor pattern and visually identify angle(s) that results in an acceptable or optimal subjective appearance. As another example, the spatial frequencies for color aliasing between the display and the opaque traces may be calculated to determine the angles and/or the trace pitches that reduce the calculated visibility. Examples of how to calculate the spatial frequencies are described in literature on human vision, for example, "Contrast Sensitivity of the Human Eye and its Effects on Image Quality" by Peter G. J. Baden. As yet another example, geometric construction may be utilized to choose a path for the traces that passes over red, green, and blue subpixels in a sequence that results in an acceptable or optimal subjective appearance. Generally, the angles 218, 220 which provide a substantially invisible appearance need not be at a maximum value of the spatial frequency for a given trace 210 and pixel 206. The eye is most sensitive to spatial frequencies of about 1-10 cycles per degree at typical touch screen viewing distances, for example about 500 to about 1000 mm. A contrast modulation of about 1 percent may be visible at the most visible spatial frequencies. To remain invisible, with for example 10 percent contrast modulation, the spatial frequency of the moiré pattern should be greater than about 40 cycles per degree, or about 50 per-cm ($cm^{-1}$). The angles 218, 220 that produce a moiré pattern with a spatial frequency greater than about 50 cm have sufficiently low visibility with a typical 10 percent modulation.

In the embodiment depicted in FIG. 2, the angle 218 of the traces 210 may be at an orientation relative to the edge 212

(and the first orientation of pixels 206 (e.g., aligned with the X axis) comprising the display device 160) that is within about +/−5 degrees of an orientation that provides maximized spatial frequency. In another embodiment, the angle 218 of the traces 210 may be, but not limited to, any one of about 30, 36, 56, or 71 degrees+/− about 5 degrees relative to the edge 212 (and the first orientation of pixels 206 (e.g., aligned with the X axis) comprising the display device 160). Although the first sensor electrodes 202 of the sensor device 150 in the embodiment depicted in FIG. 2 is disposed at an angle 222 that is perpendicular to the X axis and edge 212 of the sensor device 150, the angle 222 of the first sensor electrodes 202 may be disposed at angles other than 90 degrees.

In the embodiment depicted in FIG. 2, the angle 220 of the traces 210 may be at an orientation relative to the edge 212 (and the first orientation of pixels 206 (e.g., aligned with the X axis) comprising the display device 160) that is within about +/−5 degrees of an orientation that provides maximized spatial frequency. In another embodiment, the angle 220 may be, but not limited to anyone of about 109, 124, 144, or 150 degrees+/− about 5 degrees relative to the edge 212 (and the first orientation of pixels 206 (e.g., aligned with the X axis) comprising the display device 160).

Adjacent traces 210 having the same angular orientation (e.g., either angle 218 or angle 220) may have a spacing (i.e., periodicity) 224, 226 selected to render the traces substantially invisible. In one embodiment, not all of adjacent traces 210 are spaced similarly. In various embodiments, the second sensor electrodes 204 may be fabricated using in a similar manner using conductive traces as described above in reference to the first sensor electrodes 202.

It is noted that both the spacing 224 and angles 220, 222 may be selected together to produce the above effects. The conductive traces 210 may also be oriented using any one or combination of spacing 224 and angles 220, 222 relative to plurality of pixels 206 form a moiré pattern with the display device 160, wherein said moiré pattern comprises a pitch in a direction parallel to the first orientation smaller than the pitch of 3 cycles of pixels 206.

Other attributes of the traces 210 comprising the sensor electrodes 202, 204 also affect how visually detectable of the sensor electrodes 202, 204 are to the human eye. For example, variation in the edges of the sensor electrodes 202, 204, the variation in amount of occlusion of a particular color pixel, and the density of the traces 210 (factoring other light occluding material as further discussed below) across the sensor device 150 may all individually influence if undesirable visual patterns are formed. FIGS. 3-16 describe embodiments of sensor devices 150 which provide sensor electrodes 202, 204 having reduced visual patterns achieved through the configuration of the various of attributes of the traces 210 comprising the sensor electrodes 202, 204.

Figure 3:
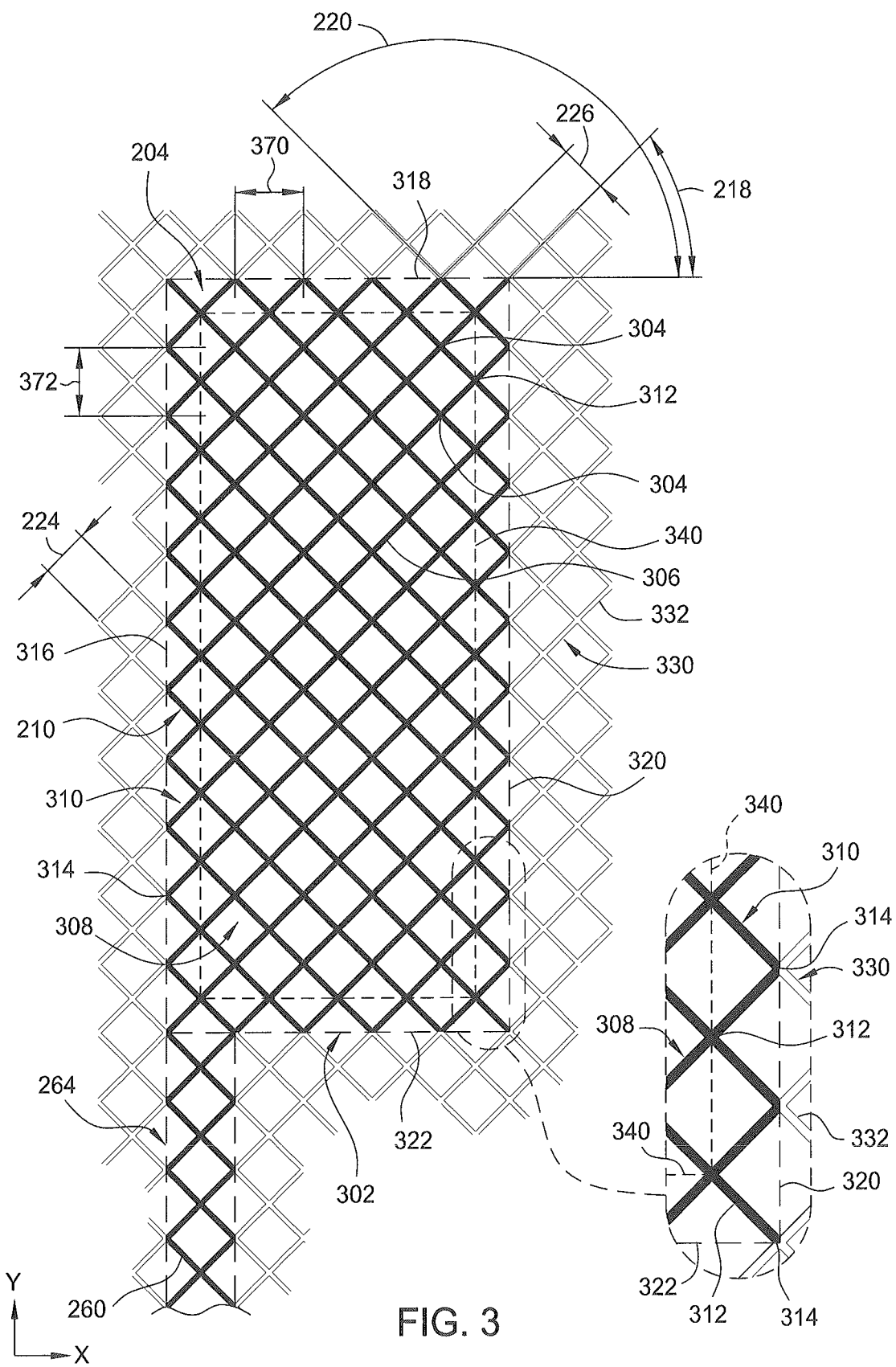
FIG. 3 is a schematic of a portion of a sensor illustrating the orientation of the traces comprising the sensor relative to an imaginary grid.

FIG. 3 is one embodiment of one of the second sensor electrodes 204 superimposed over an imaginary grid 330. The neighboring sensors electrodes 202, 204 are omitted from FIG. 3 to enhance the ease of understanding during the following description of the second sensor electrode 204 in relation to the imaginary grid 330. The imaginary grid 330 extends beyond the bounds of the second sensor electrodes 204 across the sensing region of the substrate such that one or more of the other electrodes 202, 204 comprising the input device 100 may be configured with reference to the same singular grid 330. Although only one second electrode 204 is shown in FIG. 3, it is intended that one or more other second sensor electrodes 204, and optionally one or more of the first sensor electrodes 202, may be similarly constructed.

The second sensor electrodes 204 includes a body 302 formed by the traces 210. The body 302 is connected to the processing system 110 by the conductive routing line 264, which includes the portion 260 disposed on the substrate 216.

The traces 210 forming the body 302 are arranged in a conductive mesh 306 that includes an interior portion 308 bounded by a terminal portion 310. The interior portion 308 includes traces 210 intersecting at interior intersections 304 and boundary intersections 312. The boundary intersections 312 circumscribe the interior intersections 304 and separate the terminal portion 310 from the interior intersections 304. For clarity, the boundary intersections 312 are illustrated interconnected by dashed line 340.

The terminal portions 310 extend from the boundary intersection 312 of the interior portion 308 to a terminal end 314. The terminal end 314 defines the outer perimeter (extents) of the body 302. Each portion of the trace 210 disposed in the terminal portions 310 extend from one of the boundary intersections 312 and ends at the terminal end 314. The terminal end 314 of the trace 210 may be free and unattached to other traces 210, for form an intersection with a neighboring adjacent trace 210 disposed in the terminal portions 310. Other than traces 210 intersecting at a terminal end 314, the traces 210 do not intersect within the terminal portion 310 between the boundary intersections 312 and the terminal ends 314.

As discussed above, the body 302 is defined in size by the terminal ends 314, which together, form the perimeter of the body 302. The perimeter of the body 302 depicted in FIG. 3 includes edges 316, 318, 320, 322 arranged to form a rectangle. Of course, the body 302 may have any number of edges and be shaped in other polygonal or other geometrical forms. For example, an adjacent pair of the edges 316, 318, 320, 322 on neighboring sensor electrodes may be interleaved, parallel, linear, wavy or have another geometrical interface. As shown in the enlarged portion of FIG. 3, the terminal ends 314 defining the edges 316, 318 may include one or more closed terminations 324, i.e., formed by the coupling of neighboring terminal end 314, and/or one or more open terminations 326, i.e., formed by a terminal portion 310 having an unconnected and free terminal end 314. It is desirable, in at least some embodiments, that one or more of the terminal ends 314 of adjacent traces 210 are connected at the edges 316, 318, 320, 322 of the body 302. It is also desirable, in at least some embodiments, that one or more of the connected terminal ends 314 of adjacent traces 210 are aligned with the imaginary grid 330. By ending adjacent traces 210 of the body 302 at connected terminal ends 314 in alignment with the imaginary grid 330, the conductor density, and thus performance, of the sensor electrode may be enhanced.

As illustrated in FIG. 3, the orientation of the angles 218, 220 and spacing 224, 226 of the traces 210 forming the body 302 defines the imaginary grid 330. The grid 330, illustrated by unfilled lines 332 in FIG. 3, is defined by the periodicity, angles and configuration of the traces 210 forming the interior portion 308 of the conductive mesh 306, wherein indices 334 of the grid 330 align with interior intersections 304 of the traces 210 within the interior portion 308 of the conductive mesh 306. The terminal portion 310 of the body 302, and optionally the portion 260 of the conductive routing line 264 may not necessarily conform, e.g., overlay, the grid 330 as further discussed below. The interior intersections 304 of the traces 210 within the interior portion 308 of the conductive mesh 306 define a first periodicity 370 and a second periodicity 372 which align with the imaginary grid 330. As such, the imaginary grid 330 has the same periodicity 370, 372. In at least some embodiments, it is desirable that one or both of the width (in the X direction) of the body 302 be a 0.5 multiple of distance defined by the periodicity 370 and the height (in the Y direction) of the body 302 be a 0.5 multiple of distance defined by the periodicity 372, which enhances density uniform of the traces 210 across the body 302, and between adjacent bodies 302 of neighboring sensor electrodes. In at least some embodiments, it is also desirable that one or both of the periodicity 370 and the periodicity 372 be a 0.5 multiple of the periodicity of the pixels 206.

Figure 4:
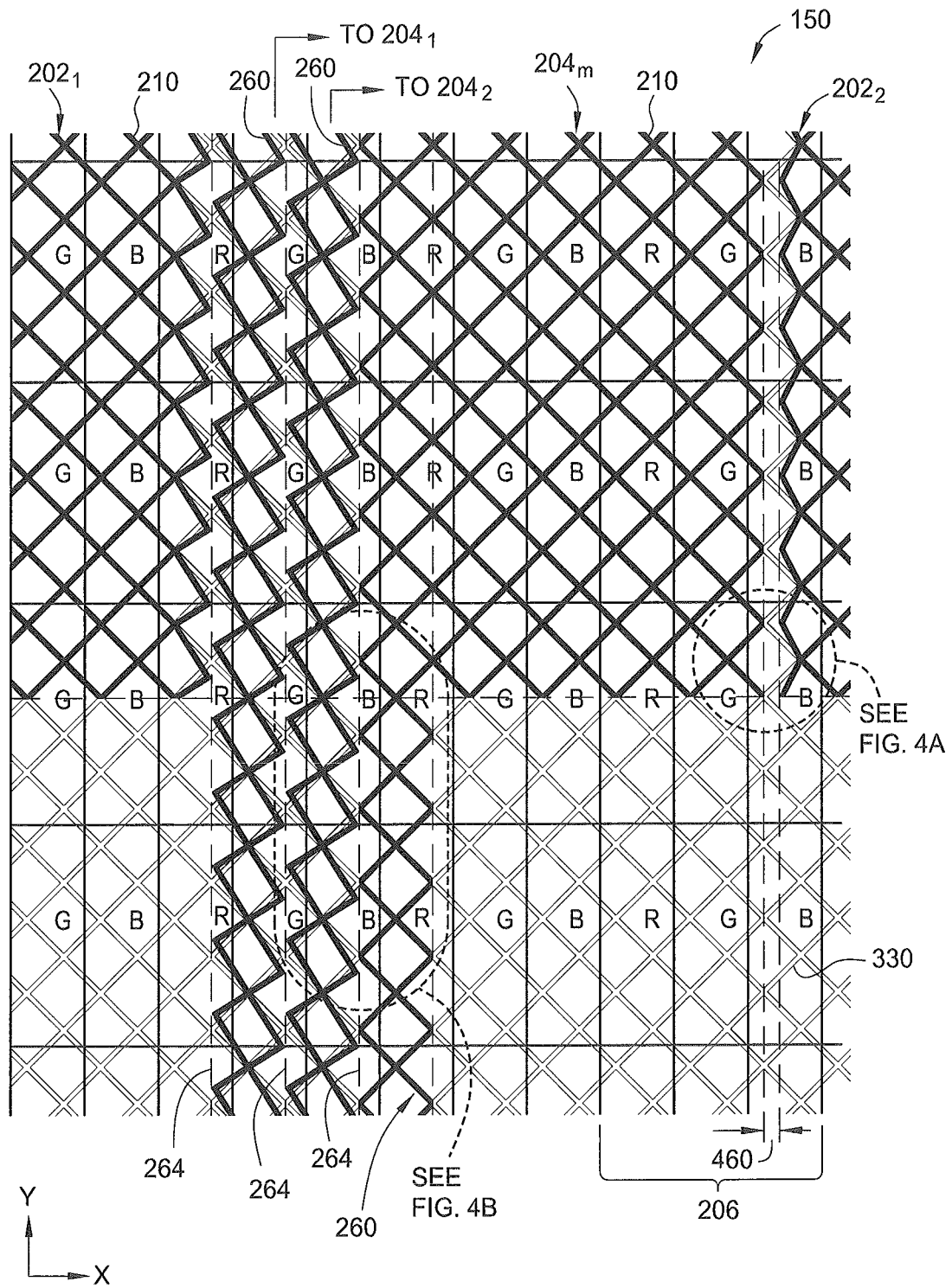
FIG. 4 is one embodiment of a portion of the sensor device of FIG. 1 illustrating is a schematic of a portion of a sensor illustrating traces comprising the sensor relation to a plurality of pixels indicated by subpixels R (red subpixels), G (green subpixels) and B (blue subpixels) relative to the imaginary grid.

FIG. 4 is a plan view of a portion of the sensor device 150 shown disposed over a portion of the display device 160. Although the display device 160 is shown with pixels 206 segmented into RGB subpixels, other subpixel configurations may be utilized. The imaginary grid 330 is also depicted in FIG. 4. In the portion of the sensor device 150 shown in FIG. 4, portions of two first sensor electrodes 202, portions 260 of three conductive routing lines 264, and portion of one second sensor electrode 204 are shown with the grid 330 overlaying the array of pixels 206.

It is desirable to have high conductor density within the sensor electrodes 202, 204 to enhance performance, but is conversely undesirable for the conductor density to be so high as to undesirably make the sensor electrodes 202, 204 visible or to create moiré patterns. Unfortunately, increasing the conductor density undesirably makes the sensor electrodes 202, 202 block an excessive amount of light. To obtain desirable conductor density, the sensor electrodes 202, 204 and portions 260 of the conductive routing lines 264 are closely packed. To obtain desirable low visibility, sensor electrodes 202, 204 and portions 260 of the conductive routing lines 264 may be configured to block only a small fraction, such as less than about 20 percent, or even less than 10 percent, of the light emitted by the display device 160. To prevent moiré pattern generation, it is desirable for each trace 210 to repeat the coverage pattern of the underlying pixels 206 across the sensor electrodes 202, 204. In such a closely packed configuration, the traces 210 at the adjacent edges 318, 322 of neighboring bodies 302 must not be so close as to allow arcing or other electrical communication which would reduce the performance of the input device 100.

In some embodiments of the invention, the terminal portions 310 of the traces 210 are "displaced" relative the interior portion of the traces 210 comprising the body 302 of at least one of the electrodes 202, 204. As utilized herein with reference to the portion of the traces 210 comparing the terminal ends 314, the term "displaced" means that at least a portion if not all of the terminal portions 310 of the traces 210 diverges, i.e., is not aligned with or is offset, from the imaginary grid 330. As utilized herein with reference to the portion of the traces 210 comparing the terminal ends 314, the term "non-diverged" means the theoretical position that the displaced terminal ends 314 would have occupied if the trace 210 was not displaced, i.e., the theoretical position is aligned with the imaginary grid 330. For example, one or more of the terminal ends 314 of the terminal portions 310 shown in the enlarged portion of the body 302 of the second electrodes $202_N$ and $204_M$ are displaced, i.e., offset from, the grid 330.

In at least some embodiments, it is advantageous for the displaced terminal ends 314 to cover a subpixel of the same color that would have been covered it the terminal end 314 had been in its "non-diverged" theoretical position in alignment with the imaginary grid 330.

Figure 4A:
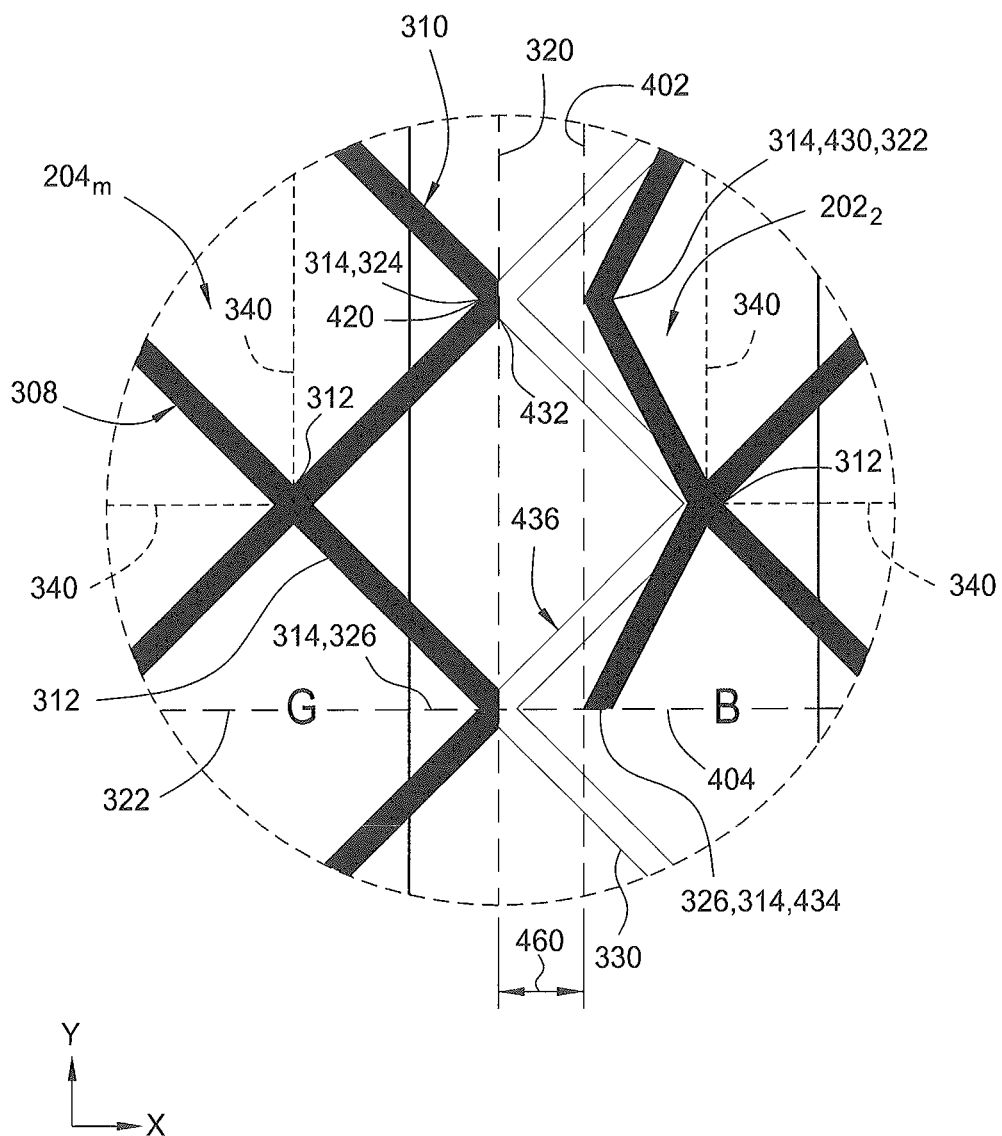
FIG. 4A is an enlarged portion of FIG. 5 illustrating adjacent edges of neighboring sensor electrodes.

Referring to the enlarged portion of FIG. 4 labeled FIG. 4A, the displaced terminal ends 314 of the first sensor electrode $202_2$ that terminate in the closed termination 324 are illustrated in a displaced position 430. That is, the displaced position 430 is offset from a non-diverged position 432 coinciding with the imaginary grid 330. Likewise, the displaced terminal end 314 of the first sensor electrode $202_2$ that terminates in the open termination 326 is illustrated in a displaced position 434. That is, the displaced position 434 is offset from a non-diverged position 436 coinciding with the imaginary grid 330. As illustrated in Detail 4A, the displaced positions 430, 434 of the displaced terminal ends remain within (i.e., over) the same respective subpixel as would the trace 210 cover if the trace 210 had been positioned in the non-diverged position 432, 436. In this manner, the amount of light blockage by the trace 210 for a given subpixel color substantially does not change across the body 302 of the first sensor electrode $202_2$. The amount and direction of the displacement of the trace 210 allows a gap 460 defined between sensor electrodes to be tailored with minimal effect on light blockage or moiré pattern generation. Other sensor electrodes and/or conductive routing lines may be similarly configured.

Figure 4B:
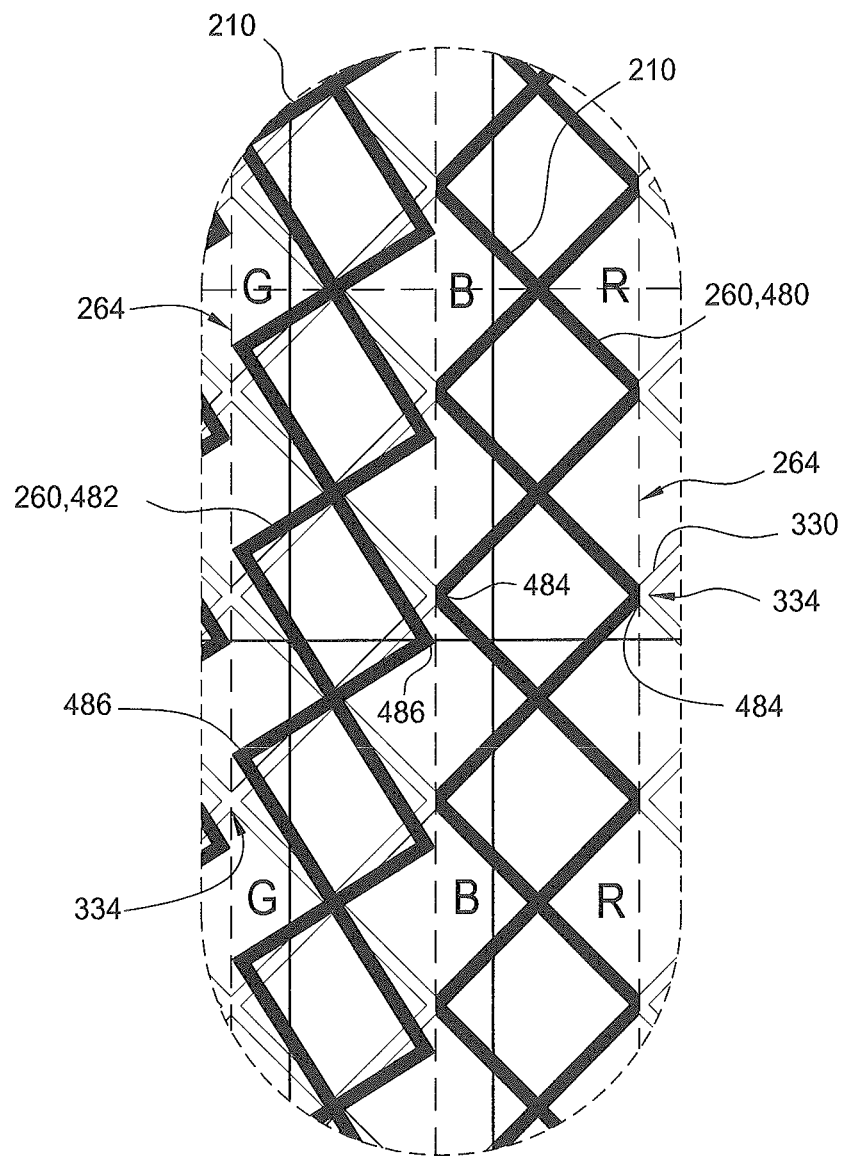
FIG. 4B is an enlarged portion of FIG. 5 illustrating adjacent traces coupled to sensor electrodes.

Referring now to a second enlarged portion of FIG. 4 labeled FIG. 4B, the traces 210 comprising the adjacent portions 260 of conductive routing lines 264 are illustrated. In the embodiment depicted in FIG. 4B, the traces 210 comprising at least one of the portions 260 of the conductive routing lines 264 are substantially displaced form the imaginary grid 330. For example, the conductive routing line 264 indicated as 480 in FIG. 4B includes traces 210 which have the same periodicity 370, 372 as the interior portion 308 of the body 302 of the second sensor electrode $204_M$, and substantially aligns with the imaginary grid 330. For example, ends 484 of the traces 210 comprising conductive routing line 480 are aligned with the indices 334 of the lines 332 forming the imaginary grid 330. The conductive routing line 264 indicated as 482 immediately adjacent to conductive routing line 480 has substantially the same periodicity 370, 372 as the conductive routing line 480, but at least some of the traces 210 comprising the conductive routing line 482 are displaced relative the imaginary grid 330. For example, ends 486 of the traces 210 comprising conductive routing line 482 are displaced from the imaginary grid 330 by a predefined amount which is substantially uniform over lengths of with the lines 480, 482 are adjacent. In other words, a distance between adjacent ends 484, 486 of the conductive routing lines 480, 482 are substantially equal. Moreover, since the displaced ends 486 remain over the same subpixel (G in the example illustrated in FIG. 4B) as would the trace 210 if in a non-diverged position 488, the traces 210 of the conductive routing line 482 block substantially the same fraction of light from each subpixel, which contributes to reducing the visibility of the conductive routing line 482.

Figure 5A:
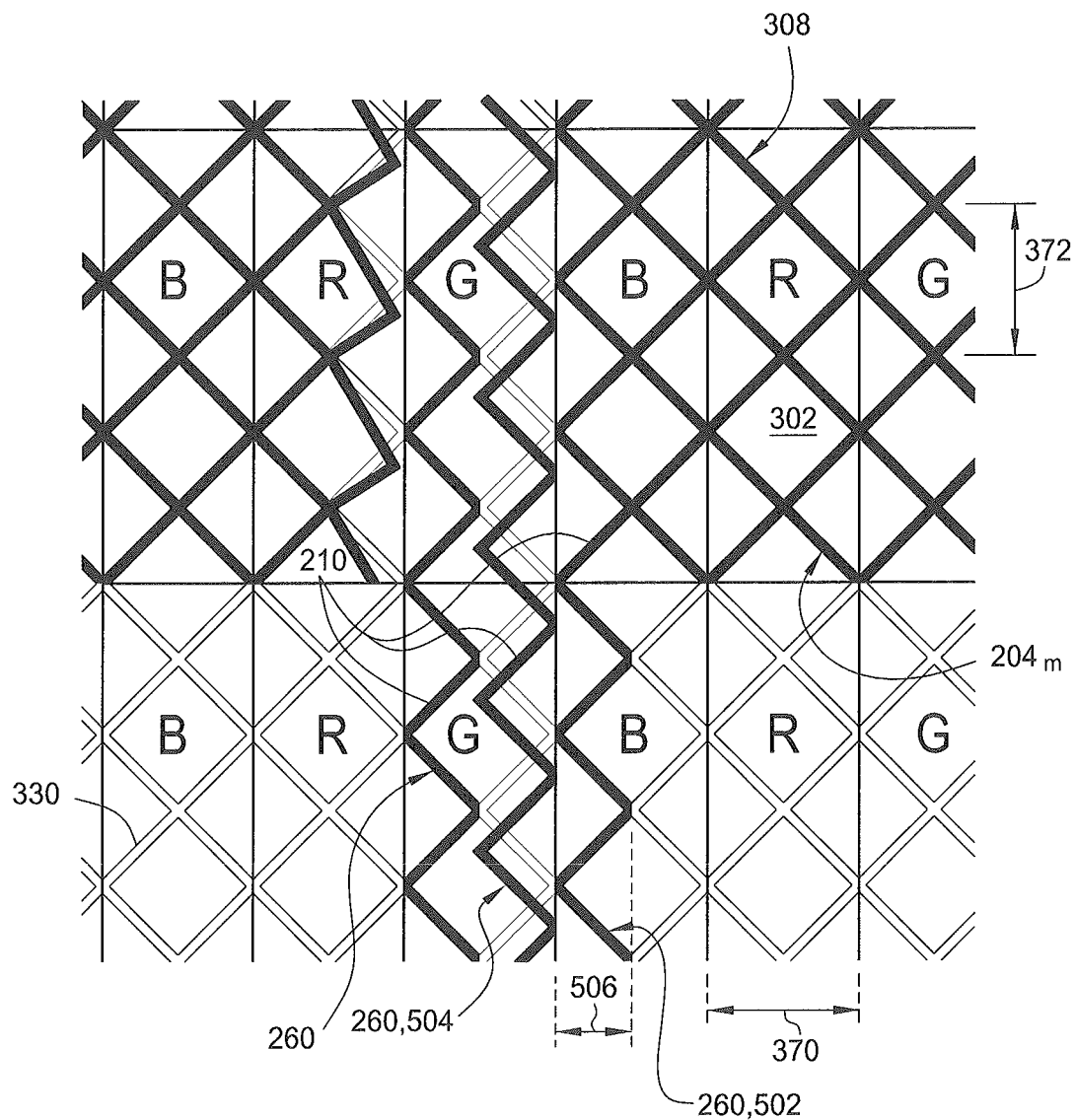
FIGS. 5A-5B illustrate alternative trace layouts relative to the imaginary grid and pixels.

FIG. 5A depicts another embodiment of traces 210 comprising the adjacent portions 260 of the conductive routing lines 264 wherein the conductive routing lines 264 have a width less than the periodicity 370 of the interior portion 308 of the body 302 of the sensor electrode to which the conductive routing lines 264 is attached, here shown as the second sensor electrode $204_M$. In the embodiment depicted in FIG. 5A, the portion 260 of the conductive routing line 264, now referred to as conductive routing line 502, has a width less than the periodicity 370 of the interior portion 308 of the body 302 to which the conductive routing line 502 is attached, for example, the second sensor electrode $204_M$. For example, the width of the conductive routing line 502 may be 0.5 (or other fraction) of the periodicity 370. The periodicity in the long (Y direction) of the conductive routing line 502 may be substantially equal to the periodicity 372. In this manner, the traces 210 comprising the conductive routing line 502 are substantially aligned with the imaginary grid 330 and the traces 210 comprising the body 302. An immediately adjacent portion 260 of the conductive routing line 264, now referred to as conductive routing line 504, has a width similar to the width of the conductive routing line 502. The conductive routing line 504 also has the same periodicity as the conductive routing line 502, but at least some of the traces 210 comprising the conductive routing line 504 are displaced relative the imaginary grid 330. In other words, the periodicity of the conductive routing line 504 is the same as the periodicity in both the X and Y directions as the conductive routing line 502, but only the conductive routing line 502 and not the conductive routing line 504 overlays the imaginary grid 330.

For example, the traces 210 comprising conductive routing line 502 have the same geometrical configuration and dimensions as the traces 210 comprising conductive routing line 504, but only one of the conductive routing lines 502, 504 is displaced from the imaginary grid 330. Since the displaced traces 210 of the conductive routing line 504 remain over the same subpixel (G in the example illustrated in FIG. 5A) as would the trace 210 if a non-diverged position aligned with the imaginary grid 330, the traces 210 of the conductive routing line 504 block substantially the same fraction of light from each subpixel, which contributes to reducing the visibility of the conductive routing line 504.

In some embodiments, the longer traces 210 comprising the conductive routing line 504 are oriented favoring the long direction of the routing line 504. In this manner, the resistance is minimized to improve sensor response time. Additionally, by configuring the conductive routing line 504 with the same periodicity (370, 372) as the body 302, the visual differences between the conductive routing line 504 and sensor electrodes 202, 204 are reduced.

Figure 5B:
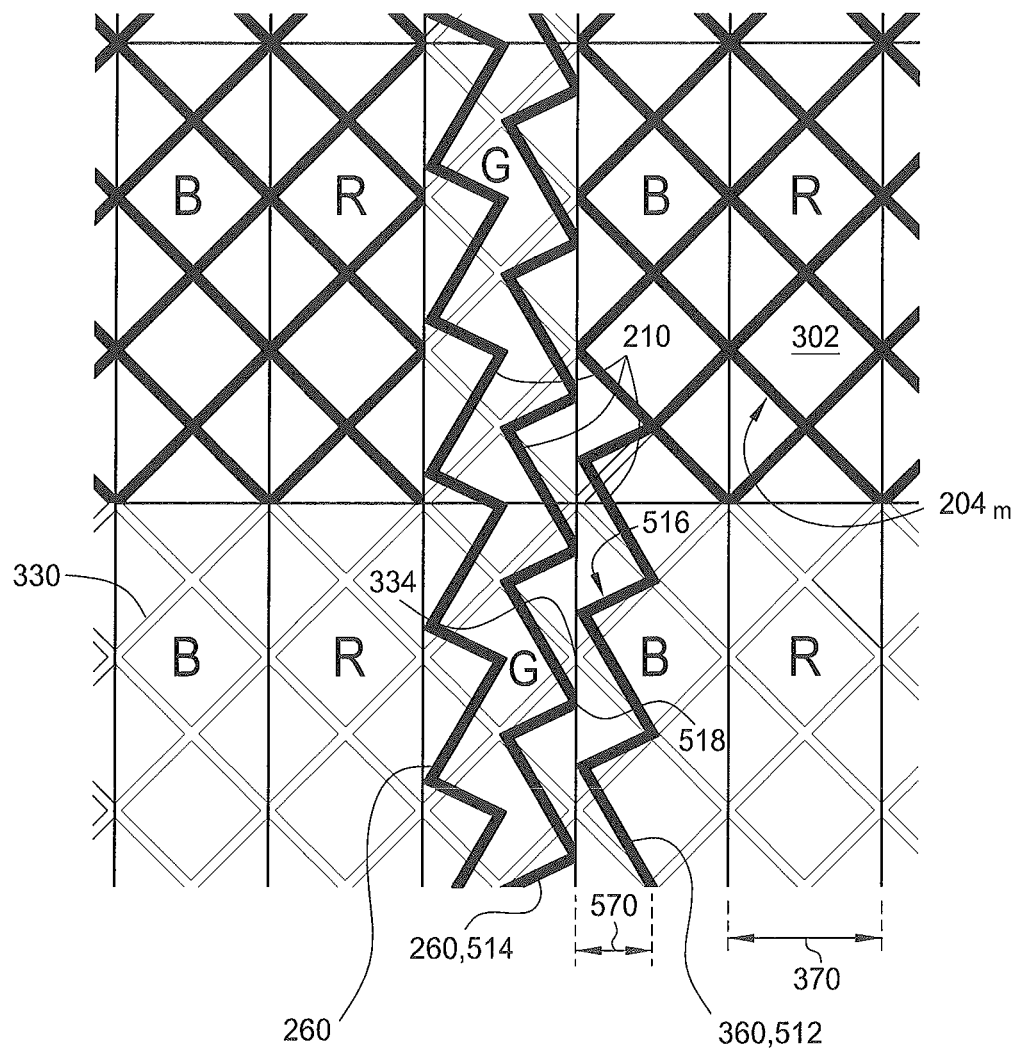

FIG. 5B depicts another embodiment of traces 210 comprising the adjacent portions 260 of the conductive routing lines 264 wherein the conductive routing lines 264 have a width less than the periodicity 370 of the interior portion 308 of the body 302 of the sensor electrode to which the conductive routing lines 264 is attached, here shown as the second sensor electrode $204_M$. In the embodiment depicted in FIG. 5B, the portion 260 of the conductive routing line 264, now referred to as conductive routing line 512, has a width less than the periodicity 370 of the interior portion 308 of the body 302 to which the conductive routing line 512 is attached, for example, the second sensor electrode $204_M$. For example, the width of the conductive routing line 512 may be 0.5 (or other fraction) of the periodicity 370. The periodicity in the long (Y direction) of the conductive routing line 512 may be substantially equal to the periodicity 372. At least some of the traces 210 comprising the conductive routing line 512 are displaced relative the imaginary grid 330. However, displaced ends 516 of the traces 210 comprising the conductive routing line 512 remain over the same subpixel (G in the example illustrated in FIG. 5B) as would the trace 210 if a non-diverged position aligned with the imaginary grid 330. Thus, the traces 210 of the conductive routing line 512 block substantially the same portion (or fraction) of light from each subpixel, which contributes to reducing the visibility of the conductive routing line 512.

An immediately adjacent portion 260 of the conductive routing line 264, now referred to as conductive routing line 514, has a width similar to the width of the conductive routing line 512. The conductive routing line 514 also has the same periodicity as the conductive routing line 512, and at least some of the traces 210 comprising the conductive routing line 514 are displaced relative the imaginary grid 330. In the embodiment depicted in FIG. 5B, displaced ends 518 of the traces 210 comprising the conductive routing line 514 remain over the same subpixel (G in the example illustrated in FIG. 5B) as would the trace 210 if a non-diverged position aligned with the imaginary grid 330. Thus, the traces 210 of the conductive routing line 514 block substantially the same portion (or fraction) of light from each subpixel, which contributes to reducing the visibility of the conductive routing line 514. Additionally, as adjacent ends 516, 518 of the traces 210 comprising neighboring conductive routing lines 512, 514 are displaced to opposite sides of the indices 334 of the lines 332 forming the imaginary grid 330 overlaying the interface between the lines 512, 514, the conductor density of the lines 512, 514 may be better balanced across the sensing region 120 while ensuring that substantially the same portion (or fraction) of light is blocked from each subpixel, which contributes to reducing the visibility of the conductive routing lines 512, 514.

The displaced terminal ends 314 of the first sensor electrode $202_1$ (or other sensor electrode) may have many alternative configurations. FIGS. 6-9 discussed below are provided by way of example, and are not intended to be inclusive of all variations in which the invention may be practiced or to limit the scope of the claims.

Figure 6:
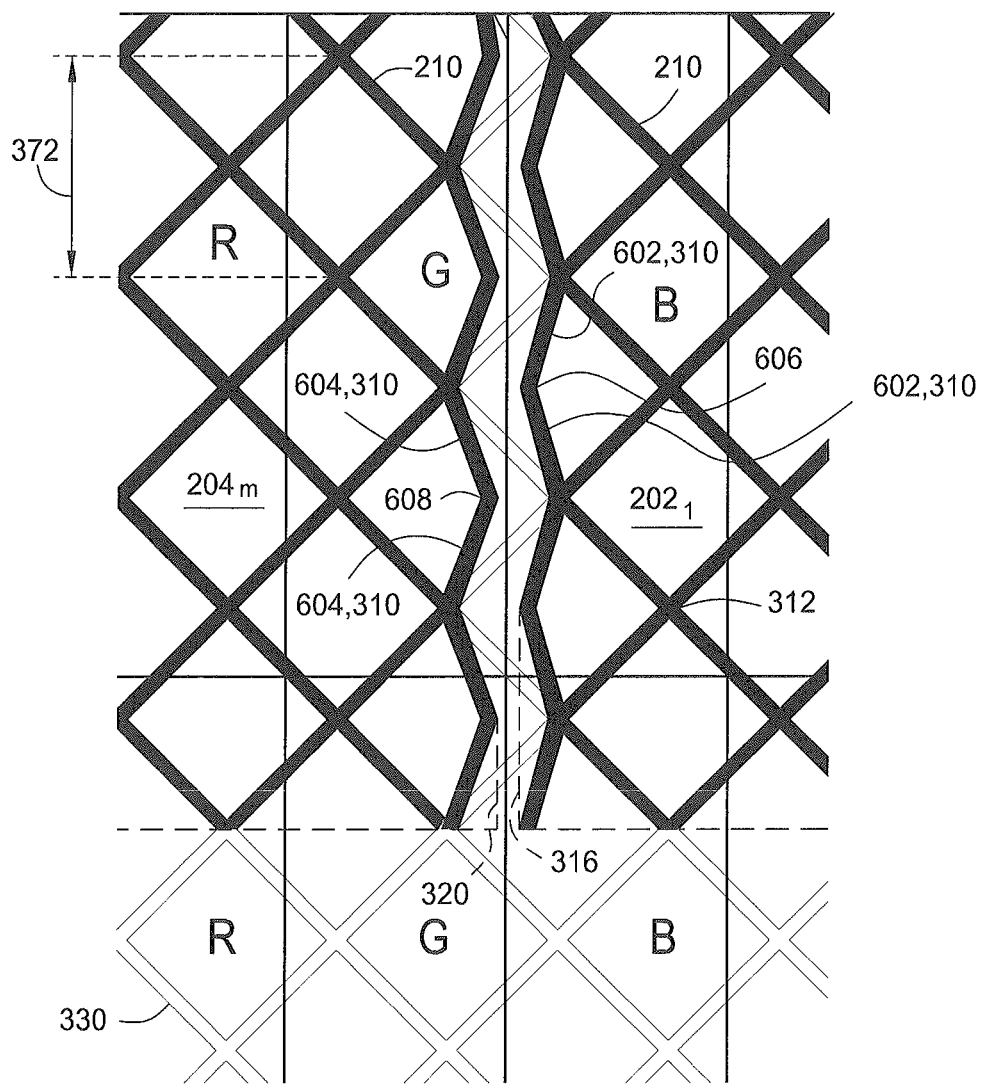
FIGS. 6-9 are partial plan views of alternative embodiments of traces along adjacent edges of neighboring sensor electrodes.

FIG. 6 is a plan view of facing edges 320, 316 of one embodiment of the second sensor electrode $204_M$ and first sensor electrode $202_1$. The displaced terminal portions 310 of the first sensor electrode $202_1$, illustrated in FIG. 6 as terminal portions 602, are at least partially displaced from the imaginary grid 330. Adjacent terminal portions 602 are joined at closed terminations 606. The displaced terminal portions 310 of the second sensor electrode $204_M$, illustrated in FIG. 6 as terminal portions 604, are also at least partially displaced from the imaginary grid 330. Adjacent terminal portions 604 are joined at closed terminations 608. The closed terminations 606, 608 have the same periodicity 372 as the body 302 of the sensor electrodes $202_1$, $204_M$. However, the closed terminations 606 are 180 degrees out of phase with the closed terminations 608. That is, the closed terminations 606 are aligned horizontally (in the X-direction) with the boundary intersections 312 of the second sensor electrode $204_M$, while the closed terminations 608 are aligned horizontally with the boundary intersections 312 of the first sensor electrode $202_1$. The relation between the closed terminations 606, 608 can also be described as being mirrored in the x-direction, and shifted ½ the periodicity 372 in the y-direction. The closed terminations 606, 608 remain over the same subpixel (G and R, respectively in the example illustrated in FIG. 6) as would the trace 210 if a non-diverged position aligned with the imaginary grid 330. Thus, the traces 210 in the terminal portions 310 of the sensor electrodes $202_1$, $204_M$ block substantially the same portion (or fraction) of light from each subpixel, which contributes to reducing the visibility of the sensor electrodes $202_1$, $204_M$.

Figure 7:
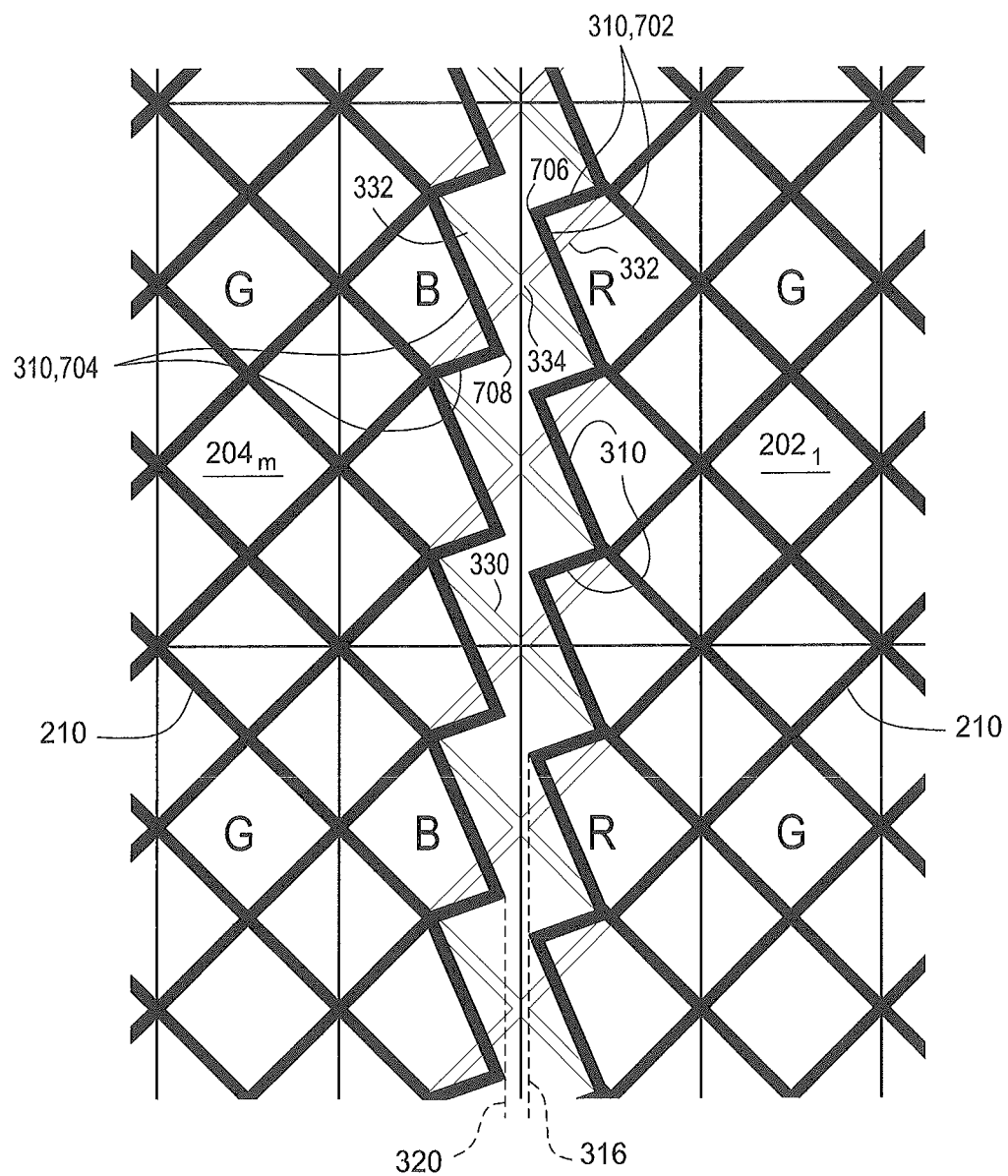
Figure 7:
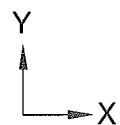

FIG. 7 is a plan view of facing edges 320, 316 of another embodiment of the second sensor electrode $204_M$ and first sensor electrode $202_1$. The displaced terminal portions 310 of the first sensor electrode $202_1$, illustrated in FIG. 7 as terminal portions 702, are at least partially displaced from the imaginary grid 330. Adjacent terminal portions 702 are joined at closed terminations 706 uniformly displaced to a first side of the indices 334 of the lines 332 forming the imaginary grid 330. The displaced terminal portions 310 of the second sensor electrode $204_M$, illustrated in FIG. 7 as terminal portions 704, are also at least partially displaced from the imaginary grid 330. Adjacent terminal portions 704 are joined at closed terminations 708 uniformly displaced to a second side of the indices 334 of the lines 332 forming the imaginary grid 330, that is, to a side opposite of the closed terminations 706 (in the Y direction). The closed terminations 706, 708 have the same periodicity 372 as the body 302 of the sensor electrodes $202_1$, $204_M$. The closed terminations 706, 708 substantially remain over the same subpixel (G and R, respectively in the example illustrated in FIG. 7) as would the trace 210 if a non-diverged position aligned with the imaginary grid 330. Thus, the traces 210 in the terminal portions 310 of the sensor electrodes $202_1$, $204_M$ block substantially the same portion (or fraction) of light from each subpixel, which contributes to reducing the visibility of the sensor electrodes $202_1$, $204_M$.

Figure 8:
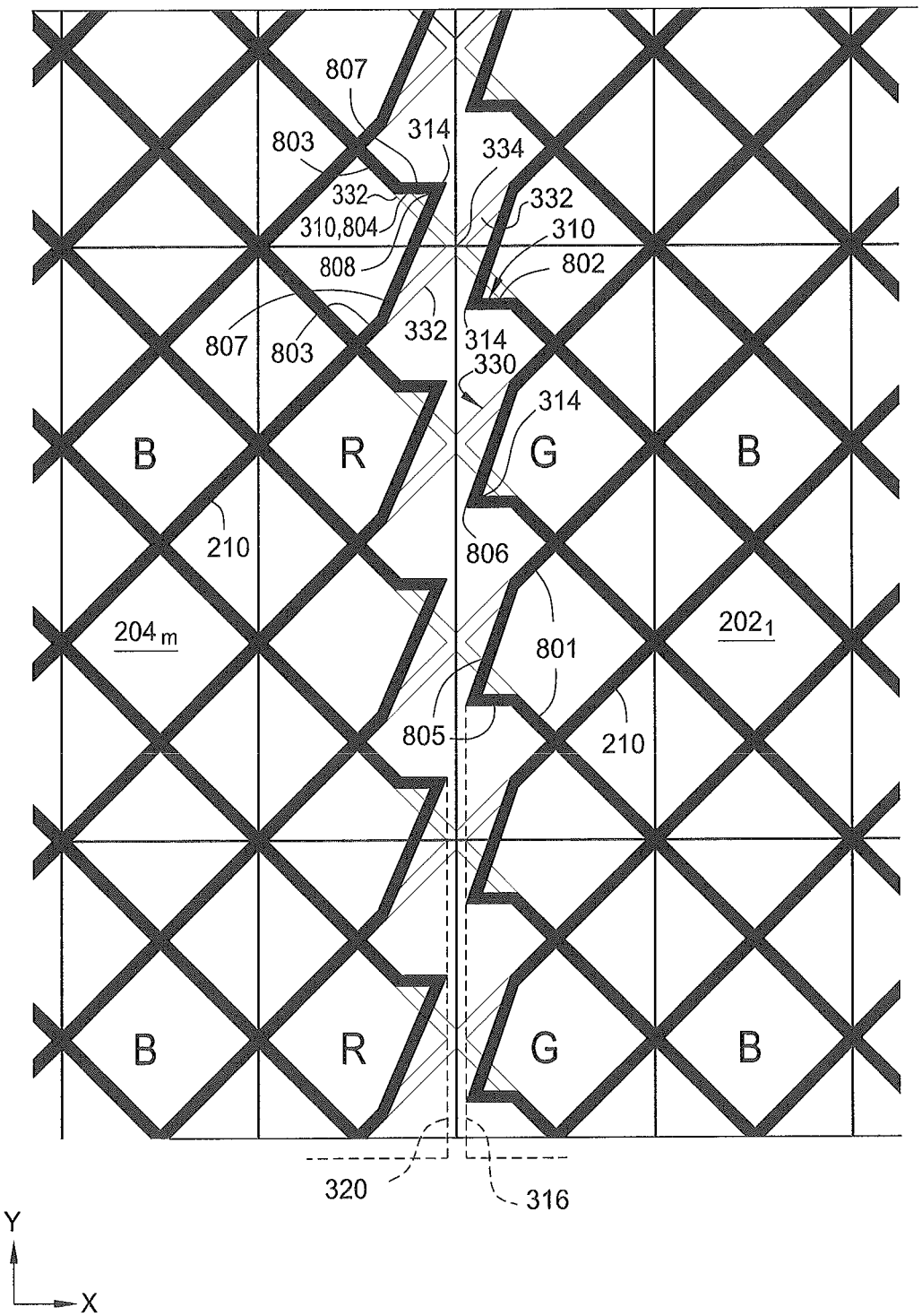

FIG. 8 is a plan view of facing edges 320, 316 of another embodiment of the second sensor electrode $204_M$ and first sensor electrode $202_1$. The displaced terminal portion 310 of the first sensor electrode $202_1$, illustrated in FIG. 8 as terminal portions 802, have a first portion 801 aligned with the imaginary grid 330 and a second portion 805 extending from the first portion 801 and terminating in terminal ends 314. The second portion 805 of the terminal portion 802 is displaced from the imaginary grid 330. Adjacent ends 314 of the terminal portions 802 are joined at closed terminations 806 uniformly displaced to a first side of the indices 334 of the lines 332 forming the imaginary grid 330. The displaced terminal portions 310 of the second sensor electrode $204_M$, illustrated in FIG. 8 as terminal portions 804, have a first portion 803 aligned with the imaginary grid 330 and a second portion 807 extending from the first portion 803 and terminating in terminal ends 314. The second portion 807 of the terminal portion 804 is displaced from the imaginary grid 330. Adjacent ends 314 of the terminal portions 804 are joined at closed terminations 808 uniformly displaced to a second side of the indices 334 of the lines 332 forming the imaginary grid 330, that is, to a side opposite of the closed terminations 806 (in the Y direction). The closed terminations 806, 808 have the same periodicity 372 as the body 302 of the sensor electrodes $202_1$, $204_M$. The closed terminations 806, 808 substantially remain over the same subpixel (G and R, respectively in the example illustrated in FIG. 8) as would the trace 210 if a non-diverged position aligned with the imaginary grid 330. Thus, the traces 210 in the terminal portions 310 of the sensor electrodes $202_1$, $204_M$ block substantially the same portion (or fraction) of light from each subpixel, which contributes to reducing the visibility of the sensor electrodes $202_1$, $204_M$.

Figure 9:
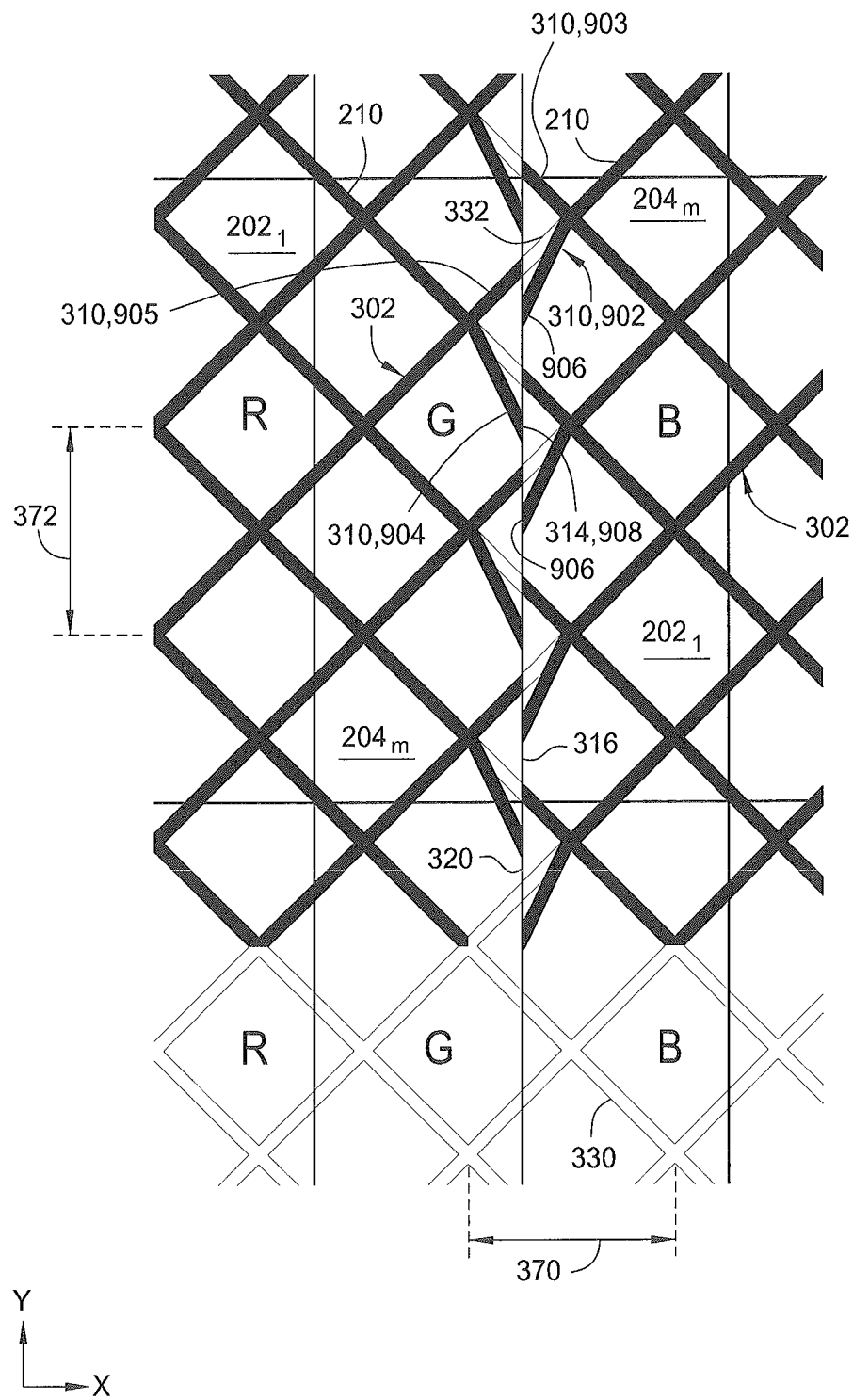

FIG. 9 is a plan view of facing edges 320, 316 of another embodiment of the second sensor electrode $204_M$ and first sensor electrode $202_1$. The terminal portion 310 of the first sensor electrode $202_1$ are illustrated in FIG. 9 as displaced terminal portions 902 and aligned terminal portions 903. The displaced terminal portions 902 have a portion at least partially displaced from the imaginary grid 330. The aligned terminal portions 903 are at least partially aligned with the imaginary grid 330. Adjacent ends 314 of the terminal portions 902, 903 are not joined and end at open terminations 906. The displaced ends 314 of the displaced terminal portions 902 are uniformly displaced to a first side of the lines 332 forming the imaginary grid 330.

The displaced terminal portions 310 of the second sensor electrode $204_M$ are illustrated in FIG. 9 as displaced terminal portions 904 and aligned terminal portions 905. The displaced terminal portions 904 are at least partially displaced from the imaginary grid 330. The aligned terminal portions 905 are at least partially aligned with the imaginary grid 330. Adjacent ends 314 of the terminal portions 904, 905 are not joined and end at open terminations 908. The open terminations 908 of the displaced terminal portions 904 are uniformly displaced to a first side of the lines 332 forming the imaginary grid 330, that is, to same side of the open terminations 906 (in the Y direction) of the displaced terminal portions 902. The open terminations 906, 908 have the same periodicity 372 as the body 302 of the sensor electrodes $202_1$, $204_M$. The open terminations 906, 908 substantially remain over the same subpixel (G and R, respectively in the example illustrated in FIG. 9) as would the trace 210 if a non-diverged position aligned with the imaginary grid 330. Thus, the traces 210 in the terminal portions 310 of the sensor electrodes $202_1$, $204_M$ block substantially the same portion (or fraction) of light from each subpixel, which contributes to reducing the visibility of the sensor electrodes $202_1$, $204_M$.

As discussed above, other attributes of the traces 210 such as the density uniformity of the traces 210 (and other light occluding material) across the sensor device 150 comprising the sensor electrodes 202, 204, will affect how visually detectable of the sensor electrodes 202, 204 are to the human eye. Thus, in at least some embodiments, it is desirable to maintain a substantially uniform density of light occluding material (i.e., the traces 210 and other light occluding elements) per unit area across the sensing region 120. The unit area can be an area of a single pixel, or an area that can be resolved by the eye. For example, approximately 1 minute of arc is about the smallest useful area human vision may resolve. Thus, for sensor devices 150 disposed at arm's length (approximately 500 mm), a unit area may have a mean diameter of 0.14 mm or greater (about 0.0154 mm$^2$). For a sensor devices 150 held closer the eye, a reasonable unit area may have a mean diameter of about 0.1 mm in diameter or greater (about 0.0073 mm$^2$). Of course, the above examples of unit area are not intended to limit the scope of the claims, and larger unit areas may be utilized.

Figure 10:
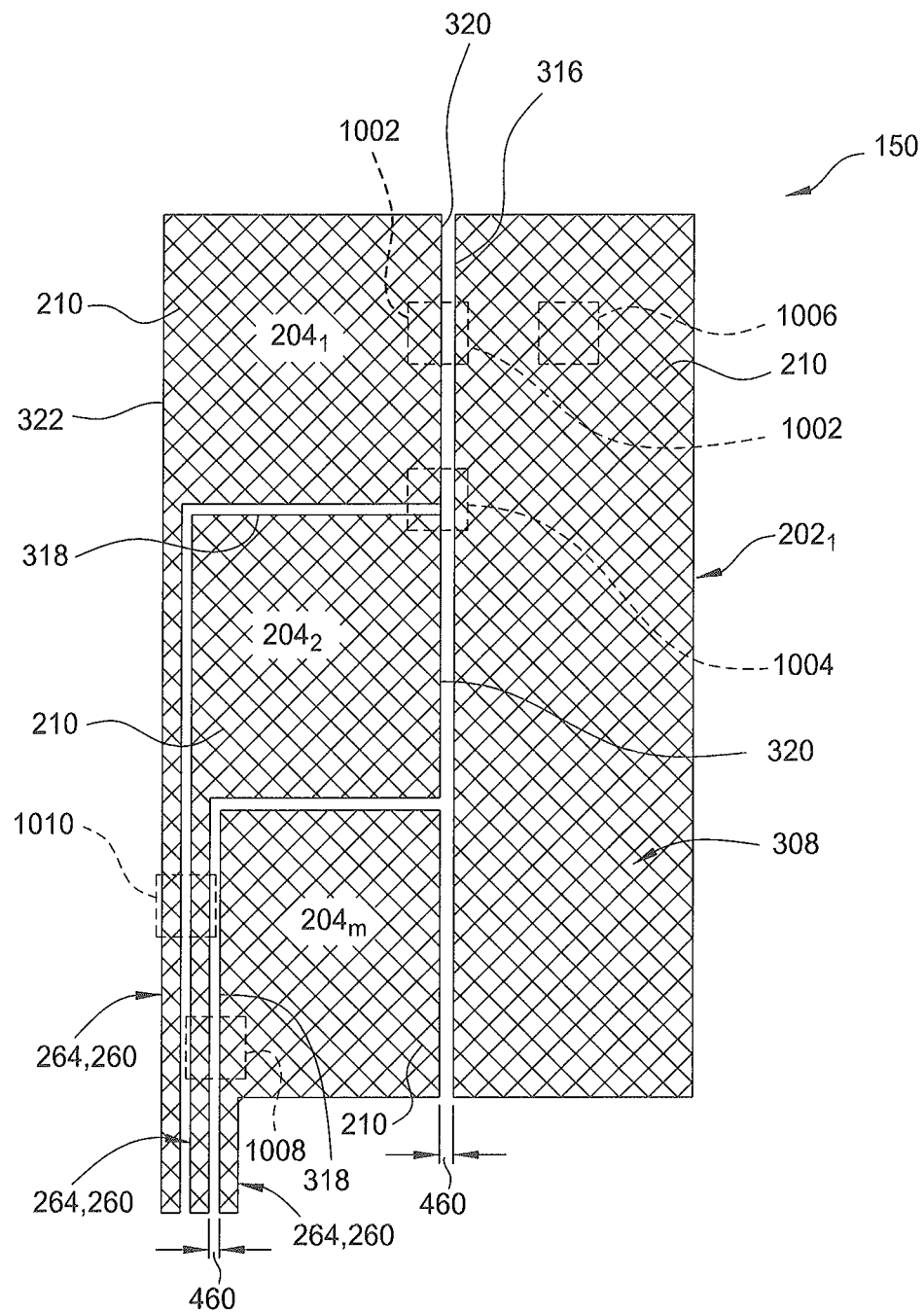
FIG. 10 is a plan view of a portion of a sensor device identifying different unit areas within the sensor device.

FIG. 10 is a partial plan schematic view of one embodiment of a sensor device 150 having sensor electrodes 202, 204. The sensor electrodes 202, 204 may be constructed as described herein, or in another manner which provides density uniformity of light occluding material, i.e., the traces 210 and other light occluding elements, across the sensor device 150 as further described below. The sensor device 150 includes the portions 260 of the conductive routing lines 264 disposed on the substrate 216 and connected to sensor electrodes $204_1$, $204_2$, and $204_M$. The portion 260 of the conductive routing line 262 connected to sensor electrodes $202_1$ may be similarly configured.

The sensor device 150 illustrated in FIG. 10 includes 5 imaginary boxes demarking unit areas in different regions of the sensor device 150 which overlay the display device 160. The size of the unit areas is generally an area that can be resolved by the eye as described above. The unit areas encompass different combinations of sensor electrodes and or conductive routing lines, and some of the unit area also encompass portions of the black matrix (e.g., interpixel area) or are entirely within the body. In the embodiment depicted in FIG. 10, unit area 1002 encompasses portions of the first sensor electrode $202_1$ and the second sensor electrode $204_1$, wherein only two edges 316, 320 of the sensor electrodes (e.g., one from each electrodes $202_1$, $204_M$) pass are within the boundaries of the unit area 1002. Unit area 1004 encompasses portions of the first sensor electrode $202_1$, the second sensor electrodes $204_1$ and the second sensor electrode $204_2$, wherein three or more edges (shown as four edges, edge 316 of the first sensor electrode $202_1$, edges 320, 322 of the second sensor electrode $204_1$, and edges 318, 320 of the second sensor electrode $204_2$) of the sensor electrodes pass are within the boundaries of the unit area 1004. Unit area 1006 encompasses only portions of the interior portion 308 of one of the sensor electrodes 202, 204, shown in FIG. 10 over the first sensor electrode $202_1$. Unit area 1008 encompasses portions of the second sensor electrodes $204_M$ and the portion 260 of the conductive routing line 264 disposed on the substrate 216 (not shown in FIG. 10). Unit area 1010 encompasses portions of neighboring portions 260 of conductive routing lines 264 disposed on the substrate 216.

In the example described with reference to FIG. 10 and other embodiments described herein, the plan area of the light occluding materials (i.e., the traces 210 and light occluding elements) within a predefined unit area, i.e., specific areal density, will be referred to as the "blockage area". The blockage area is intended encompass all light occluding material, such as the traces 210 alone, the traces 210 and other light occluding elements, and light occluding elements alone. The blockage area for the traces 210 may be determined using the width, spacing and angular orientation of the traces 210 within a given unit area. Examples of light occluding elements are described below with reference to FIGS. 12-17. The blockage area in at least two or more, including any combinations, of the units areas 1002, 1004, 1006, 1008, 1010 are substantially equal, for example, within less than about 5%, and wherein less visibility is desired, less than about 2%. At equal to or less than about 1%, the traces and light occluding elements will be substantially invisible. For example, the blockage area within unit area 1006 may be substantially equal to the blockage area attributable to the traces 210 and other light occluding elements, if present, within one or more of the unit areas 1002, 1004, 1008, and 1010. By having the blockage area be substantially equal across least two or more of the units areas 1002, 1004, 1006, 1008, 1010, the amount of pixel light blocked, for example by the traces 210, is substantially uniform across these areas, thus reducing and/or eliminating perceptible visual differences across the sensor device 150, and thus enhancing the performance of the display device 160 without diminishing touch sensing performance of the input device 100.

To compensate of the lack of traces 210 across the gap 460 defined between sensor electrodes 202, 204 and/or conductive routing traces 264, the plan area of light occluding material in the terminal portions 310 of the sensor electrodes 202, 204 may differ, for example be greater, than the blockage area solely attributable to the traces 210 within the interior portion 308 of the body 302. This may be accomplished by increasing one or more of the width, decreasing the spacing and changing the angular orientation of the traces 210 within terminal portions 310 relative to the traces 210 present in the interior portion 308 of the body 302. Additionally or in the alternative, the plan area of light occluding material in the terminal portions 310 of the sensor electrodes 202, 204 may be increased, thereby increasing the plan area attributable to light occluding elements in the terminal portions 310 of the sensor electrodes 202, 204.

Figure 11:
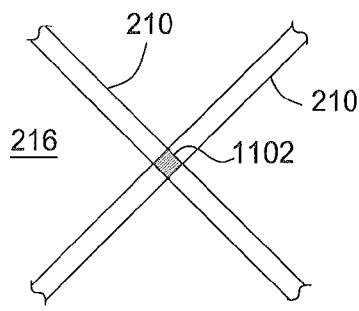
FIGS. 11-14 are plan views of a portion of a sensor electrode at an intersection of two traces, according to different embodiments.

FIG. 11 is a schematic plan view of two crossing traces 210 having substantially uniform trace width. The crossing traces 210 may be formed as a single layer of material on the substrate 216, or on different layers stacked in the input device 100. At the intersection of the traces 210, an intersecting portion 1102 has a plan area equivalent to the portion of a single trace that is shared (e.g., overlaps) the intersecting second trace. Accordingly, the total plan area of the intersecting traces 210 is less than that of two non-intersecting traces 210 of equal length, or for example when traces intersect at 90 degrees, the product of the widths of each trace. Thus, the plan area the intersecting portion 1102 may be modified to increase the total plan area of the two crossing traces 210 to substantially that of two non-intersecting traces 210 of equal length within a unit area. Increasing the total plan area of the two crossing traces 210 may be realized by modifying the traces 210 at or near the intersecting portion 1102, and alternatively or in addition, adding light occluding at or near the intersecting portion 1102.

Figure 12:
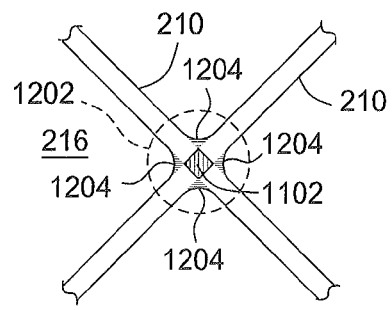

FIG. 12 is a schematic plan view of two crossing traces 210 configured to have a greater plan area relative to the embodiment depicted in FIG. 11 that has substantially uniform trace width. In the embodiment depicted in FIG. 12, the crossing traces 210 may be formed as a single layer of material on the substrate 216. The traces 210 intersect at an intersecting portion 1202, wherein the intersecting portion 1202 includes the plan area 1102 associated with the widths of the crossing traces 210 and also includes one or more attached light occluding elements 1204 formed between at least two adjacent portions of the traces 210. The light occluding element 1204 may have any convenient plan form, and in the embodiment depicted in FIG. 12, the light occluding element 1204 is in a form of a radius defined between the traces 210 meeting at the intersecting portion 1202. The plan area attributable to the light occluding element 1204 may be about equal to the plan area of the intersecting portion 1102. Thus, the intersecting portion 1202 has a plan area greater than that of the portion of a single trace that is shared (e.g., overlaps) an intersecting second trace, thereby improving the plan area uniformity and consequently, reducing the visual perceptibility of the sensor electrodes 202, 204.

Figure 13:
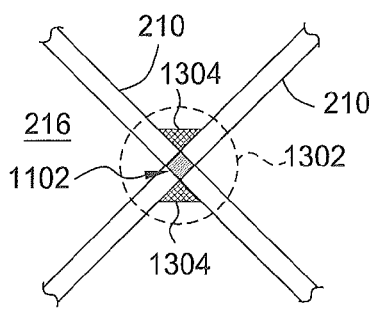

FIG. 13 is a schematic plan view of two crossing traces 210 configured to have a greater plan area relative to the embodiment depicted in FIG. 11 that has substantially uniform trace width. In the embodiment depicted in FIG. 13, the crossing traces 210 may be formed as a single layer of material on the substrate 216. The traces 210 intersect at an intersecting portion 1302, wherein the intersecting portion 1302 includes the plan area 1102 associated with the widths of the crossing traces 210 and also includes one or more attached light occluding elements 1304 formed between at least two adjacent portions of the traces 210. The light occluding element 1304 may have any convenient plan form, and in the embodiment depicted in FIG. 13 the light occluding element 1304 is in the form of a web connecting the traces 210 defining the intersecting portion 1302. The light occluding element 1304 may be of any suitable plan area, and in one embodiment, plan area attributable to the light occluding element 1304 may be about equal to the plan area of the intersecting portion 1102. Thus, the intersecting portion 1302 has a plan area greater than that of the portion of a single trace that is shared (e.g., overlaps) an intersecting second trace, thereby improving the plan area uniformity and consequently, reducing the visual perceptibility of the sensor electrodes 202, 204.

Figure 14:
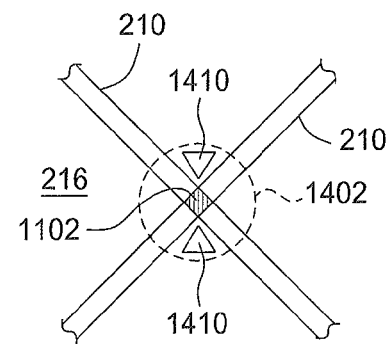

FIG. 14 is a schematic plan view of two crossing traces 210 configured to have a greater plan area relative to the embodiment depicted in FIG. 11 that has substantially uniform trace width. In the embodiment depicted in FIG. 14, the crossing traces 210 may be formed as a single layer of material on the substrate 216, or on different layers stacked in the input device 100. At the intersection of the traces 210, an intersecting portion 1402 has a plan area equivalent to that of the portion of a single trace that is shared (e.g., overlaps) an intersecting second trace, such as the intersecting portion 1102, or less than about twice that of the intersecting portion 1102. The intersecting portion 1402 may be similar in plan area to the intersecting portions 1102, 1202, 1302.

Figure 15:
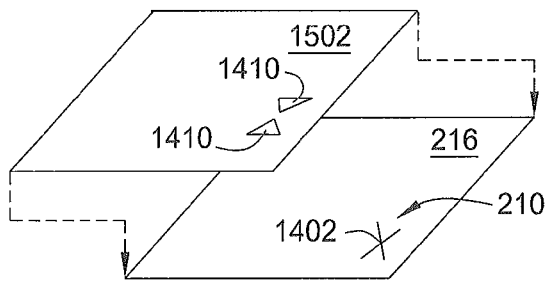
FIG. 15 is an exploded view of one embodiment of a sensing device having two traces intersecting as depicted in FIG. 14.

One or more detached light occluding elements 1410 proximate the intersection of the traces 210, and contribute to the plan area of the intersecting portion 1402. The one or more detached light occluding elements 1410 may be disposed on the same substrate 216 as one or more of the traces 210 comprising the intersecting portion 1402 as illustrated in FIG. 14, or on a second substrate 1502 stacked over the substrate 216 within the input device 100 as illustrated in FIG. 15. The detached light occluding elements 1410 are fabricated from a material that is opaque or that blocks the light generated by the pixels 206, thus contributing to the total blocked plan area of the light occluding material in a given unit area of the sensor device 150. The detached light occluding elements 1410 may be fabricated from a conductive material, such as a conductive material suitable for fabrication of the traces 210. Alternatively, the detached light occluding elements 1410 may be fabricated from a suitable dielectric material. The detached light occluding elements 1410, being spaced from the traces 210, are not electrically connected with the traces 210.

The detached light occluding elements 1410 may have any suitable geometry and size. In the embodiment, the plan area, determined by the number and size of the detached light occluding elements 1410, may be selected to increase the total blocked plan area of the intersecting portion 1402 up to about twice the plan area the intersecting portion 1102.

In the embodiment depicted in FIG. 14, the traces 210 and detached light occluding elements 1410 are disposed on the same substrate 216. The traces 210 and detached light occluding elements 1410 may be on the same or opposite sides of the substrate 216. The detached light occluding elements 1410 are shown positioned laterally space from the traces 210, between the vertices of intersecting portion 1402.

In the embodiment depicted in FIG. 15, the traces 210 comprising at least one of the sensor electrodes 202, 204 are disposed on the substrate 216, while the detached light occluding elements 1410 are disposed on the second substrate 1502 stacked over the substrate 216 within the input device 100. The detached light occluding elements 1410 are shown positioned laterally space from the traces 210, but between the vertices of intersecting portion 1402 once the substrates 216, 1502 are vertically stacked.

Figure 16:
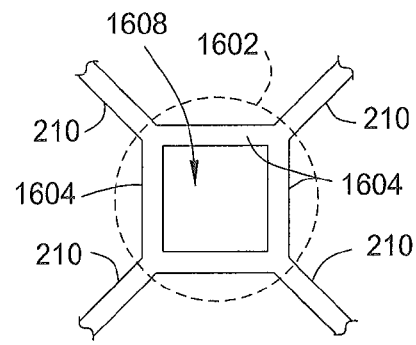
FIGS. 16-18 are plan views of terminal ends of traces comprising a sensor electrode, according to different embodiments.

FIG. 16 is a schematic plan view of two crossing traces 210 configured to have a greater plan area relative to the embodiment depicted in FIG. 11 that has substantially uniform trace width. In the embodiment depicted in FIG. 16, the crossing traces 210 may be formed as a single layer of material on the substrate 216. The traces 210 intersect at an intersecting portion 1602, wherein the intersecting portion 1602 includes one or more attached light occluding elements 1604 formed between at least two adjacent portions of the traces 210. The light occluding element 1604 may have any form, and in the embodiment depicted in FIG. 16 the light occluding element 1604 is in the form of a trace connecting the traces 210 defining the intersecting portion 1602, such that the light occluding element 1604 comprising the intersecting portion 1602 does not align with the web 330 (not shown in FIG. 16). For example, an open area 1608 may be bounded within the intersecting portion 1602 by the light occluding elements 1604 that couple adjacent traces 210. The light occluding elements 1604 may be of any suitable plan area, and in one embodiment, plan area attributable to the light occluding element 1604 may be about equal to the plan area of the intersecting portion 1102. Thus, the intersecting portion 1602 has a plan area greater than that of the portion of a single trace that is shared (e.g., overlaps) an intersecting second trace, thereby improving the plan area uniformity and consequently, reducing the visual perceptibility of the sensor electrodes 202, 204.

Figure 17:
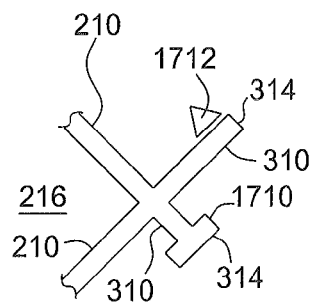

FIG. 17 is a schematic plan view of two traces 210 having terminal ends 314, one with configured with an attached light occluding element 1710. The second terminal end 314 is disposed adjacent a detached light occluding element 1712. Although both attached and detached light occluding elements 1710, 1712 are illustrated in FIG. 17, the sensor electrodes 202, 204 may be configured with solely attached light occluding elements 1710, solely detached light occluding elements 1712, or combinations thereof.

Figure 18:
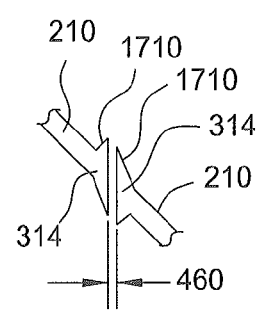

The attached light occluding element 1710 is a deviation to the local plan area over a short segment of the trace 210. Here, the attached light occluding element 1710 is illustrated as an increased width of the trace 210 comprising the terminal end 314. The attached light occluding element 1710 may be utilized to compensate for the reduction in plan area of the terminal end 314 of a trace 210 at an edge of a sensor electrode having an open terminations 326 (as shown in FIG. 4A) which is displaced from the grid 330, or to compensate for the absence of traces 210 in the gap 460 between neighboring sensor electrodes or conductive routing lines (as shown in FIG. 18). The detached light occluding elements 1712 may be disposed close to the terminal end 314 to provide similar effects.

The intersecting portion 1702 may be configured similar to the similar to the intersecting portion 1402. Thus, the attached light occluding elements 1710 and/or detached light occluding elements 1712 may have selected with any suitable geometry and size such that the plan area, determined by the number and size of the light occluding elements 1710, 1712, may be selected to increase the total blocked plan area of a unit area that includes open terminations 326 such that the blocked plan area is uniform across different areas (such as unit areas illustrated in FIG. 10) to prevent undesired visual effects.

FIG. 18 is a schematic plan view of traces 210 of different sensor electrodes 202, 204 aligned across a gap 460. A terminal end 314 of each trace 210 includes an attached light occluding element 1710. The size and geometry and size of the light occluding element 1710 may be selected to compensate for the lack of traces 210 across the 460 so that the total plan area in a unit area spanning the gap 460, such as unit area 1002, 1004, 1006 illustrated in FIG. 10, so that the blocked plan area is uniform across different unit area to prevent undesired visual effects.

Figure 19:
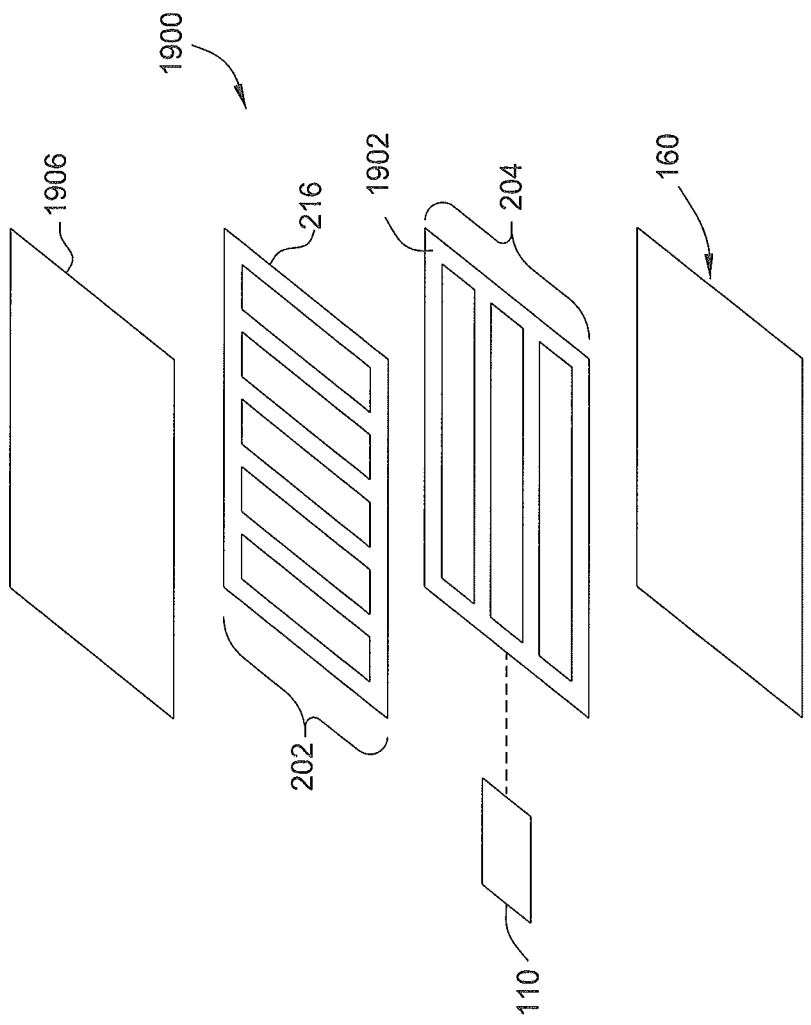
FIG. 19 is an exploded view of one embodiment of a sensing device having sensor electrodes on different substrates.
Figure 20:
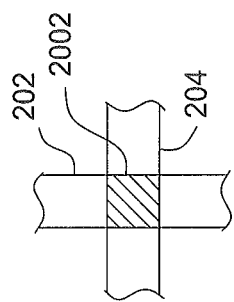
FIG. 20 is a plan view of a portion of the sensing device of FIG. 18 illustrating the crossing of two sensor electrodes.

FIG. 19 is an exploded plan view of one embodiment of an input device 1900. The input device 1900 is substantially similar to the input device 100 described above, except that the sensor elements 202, 204 are disposed on different substrates 216, 1902. The substrate 1902 having the sensor elements 204 may be part of, or on top of, the display device 160, and in one embodiment, the sensor elements 204 comprise the VCOM electrodes of the display device 160. With additional reference to FIG. 20, an overlapping region 2002 is defined where one sensor element 202 is vertically aligned with another sensor element 204. If the overlapping region 2002 of the sensor elements 202, 204 had the same blocked plan area as non-overlapping regions 2004 of the sensor elements 202, 204, the total blocked plan area across larger unit areas (such as illustrated in FIG. 10) would not be uniform. Thus, at least one of the trace pattern, trace width, and use of light occluding elements may be utilized it increase the total blocked plan area such that unit area bounded solely within a single sensor 202 may be substantially equal to unit area that includes one or more overlapping region 2002 of adjacent sensor elements 202, 204.

Figure 21:
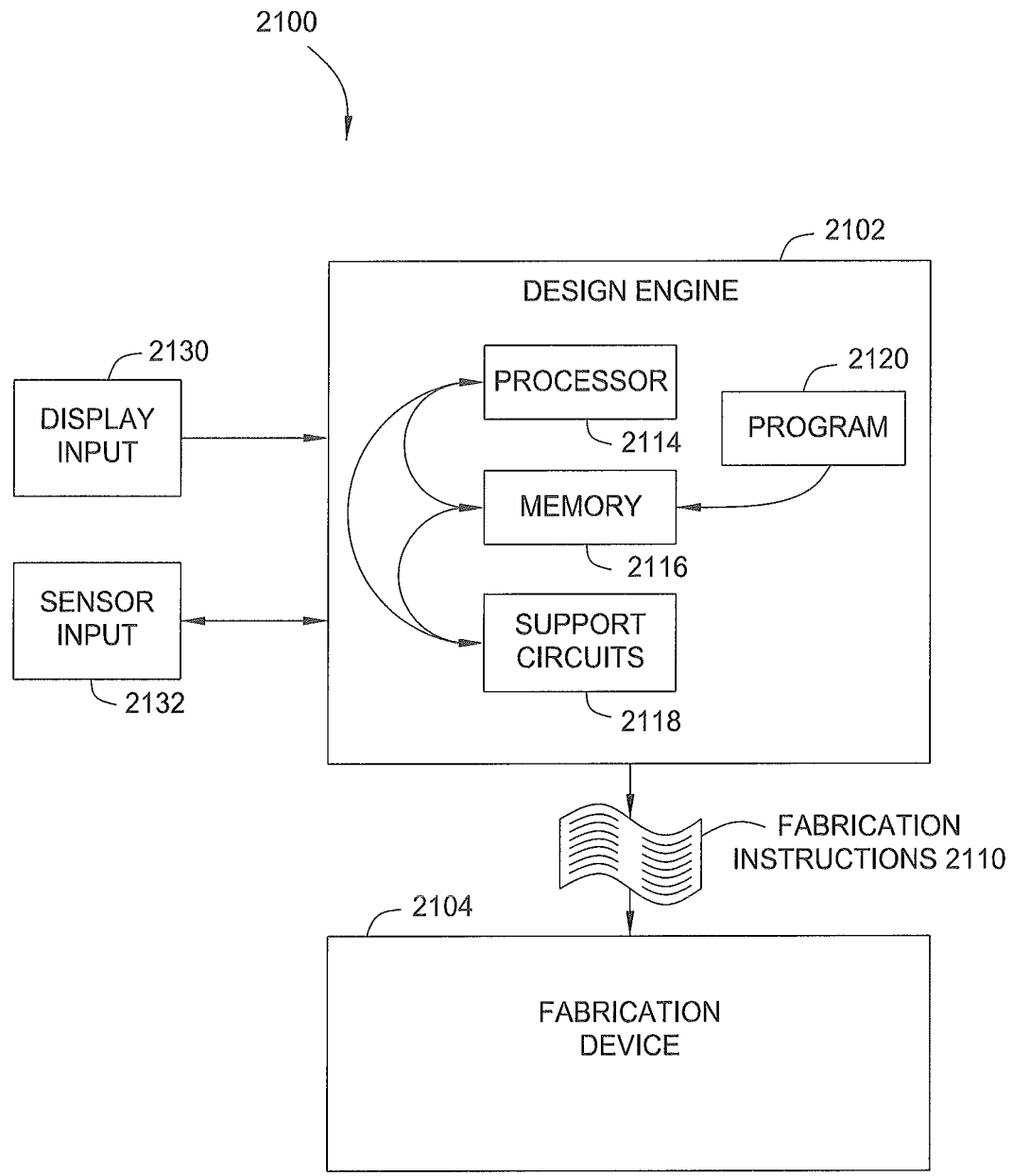
FIG. 21 is a schematic diagram of one embodiment of a method for making a mesh sensor electrode To facilitate understanding, identical reference numerals have been used, where possible, to designate identical elements that are common to the figures. It is contemplated that elements disclosed in one embodiment may be beneficially utilized on other embodiments without specific recitation.

In addition to input devices having metal mesh sensor electrodes as described above, the invention includes a method for making such sensor electrodes for use in an input device. The method may be utilized by design houses and sensor fabricators. FIG. 21 is a schematic diagram of one embodiment of a method 2100 for making a mesh sensor electrode, such as at least one of the sensor electrodes 202, 204 described above.

The method 2100 utilizes a design engine 2102 configured to generate design instructions 2110 for use by a fabrication device 2104. The fabrication device 2104 may be any device suitable for forming traces 210 configured and arranged as the sensor electrodes 202, 204 described above. The fabrication device 2104 may be configured to deposit a sheet of conductive material, then selectively remove portions of the conductive material, leaving traces 210 in a pattern forming the sensor electrodes 202, 204. For example, the fabrication device 2104 may include deposition and removal devices, such as printing devices, inkjet devices, physical vapor deposition devices, plating devices, chemical vapor deposition devices, and spray deposition device, among other suitable deposition devices, while the removal device may include lithographic devices, wet etch devices, dry (plasma) etch devices, and laser ablation devices, among other removal devices. Alternatively, the fabrication device 2104 may directly form the traces 210 and sensor electrodes 202, 204. For example, the fabrication device 2104 may be an ink jet printing device, stamping devices, and plating devices, among other fabrication devices.

The design instructions 2110 generated by the design engine 2102 is in a form suitable for providing and/or generating machine instructions executable by the fabrication device 2104 to generate the traces 210 and sensor electrodes 202, 204. For example, the design instructions 2110 may be an output CAD or CAM file, such as DXF, Gerber and GDSII, among others. The design instructions 2110 may reside in the design engine 2102 and be accessed by the fabrication device 2104. The design instructions 2110 may alternatively loaded into memory of a processor controlling the function of fabrication device 2104. The design instructions 2110 may also be transferred to a memory or processor of the fabrication device 2104 from the design engine 2102, for example, over a network or as computer readable media disposed on a portable digital storage device. The design instructions 2110 may be for a complete sensing device 150, or the design instructions 2110 may be partial, specifying any portion of the sensing device 150.

The design engine 2102 generally includes a processor 2114, memory 2116 and control circuits 2118 for the processor 2114 and facilitates control of the fabrication device 2104 and, as such, of the sensor electrode design process, as discussed below in further detail. The processor 2114 may be one of any form of general-purpose computer processor that can be used for generating machine instructions executable by the fabrication device 2104. The memory 2116 of the processor 2114 may be one or more of readily available memory such as random access memory (RAM), read only memory (ROM), floppy disk, hard disk, or any other form of digital storage, local or remote. The support circuits 2118 are coupled to the processor 2114 for supporting the processor in a conventional manner. These circuits 2118 may include cache, power supplies, clock circuits, input/output circuitry and subsystems, and the like. A program 2120 is stored in the memory 2106 or other computer-readable medium accessible to the processor 2114 and executable as a software routine to generate the fabrication instructions 2110. An exemplary program 2120 which may be adapted to practice the invention include Design Studio™ 4 (DS4), available from Synaptics. Inc., located in Santa Clara, Calif.

The design engine 2102 allows a user, such as a design house, an input device provider, a sensor fabricator and the like, to input attributes of the sensor electrodes and display device, illustrated as display inputs 2130 and sensor input 2132, to obtain an input device having reduced visual effects. The display inputs 2130 generally include display size, display type, display orientation (landscape or portrait), pixel pitch, pixel layout and the like.

The design engine 2102 may be configured to provide an optimal sensor electrode layout (i.e., relative positions of one sensor electrode to another) for a particular mesh configuration, or provide an optimal mesh configuration for a predetermined sensor layout.

For example, the user may indicate as one of the sensor inputs 2132 that a predefined layout geometry of sensors 202, 204 is desired, which that the design engine 2102 determines one or more of the mesh pattern attributes, i.e., the spacing 224, 226, angles 218, 220, width of the traces 210, trace material, trace thickness, position of the terminal ends 314 relative to the grid 330, and the like. The design engine 2102 may provide sensor reflectance or transmittance, which affects how visible the sensor electrodes are, and sensor conductor density, which affects sensor electrical performance, of the sensor electrode design initially generated by the design engine 2102 as a feed-back output to the user. Thus, if the user does not wish to utilize the reflectance or transmittance or sensor conductor initial density determined by the design engine 2102, the user may set a desired amount of reflectance or transmittance and/or sensor conductor density by inputting a value for the reflectance or transmittance and/or sensor conductor density to the design engine 2102 as a sensor input 2102, for which in turn the design engine 2102 will recalculate the mesh pattern attributes and/or sensor electrode layout having the desired reflectance or transmittance and/or sensor conductor density. Any one or more of the mesh pattern attributes may also be provided by the user as a sensor input 2130, so that the design engine 2102 provides an output having the desired visual and performance characteristics.

For example, the user may wish for the design engine 2102 to determine one or more of the mesh pattern attributes along with the layout geometry of sensors 202, 204. The design engine 2102 may again provide sensor reflectance or transmittance and sensor conductor density of the mesh electrode design initially generated by the design engine 2102 as a feed-back output to the user. Thus, if the user does not wish to utilize the reflectance or transmittance or sensor conductor initial density determined by the design engine 2102, the user may set a desired amount of reflectance or transmittance and/or sensor conductor density by inputting a value for the reflectance or transmittance and/or sensor conductor density to the design engine 2102 as a sensor input 2102, for which in turn the design engine 2102 will recalculate the mesh pattern attributes and/or sensor electrode layout having the desired reflectance or transmittance and/or sensor conductor density.

In another example, the user may allow the design engine 2102 to determine at least one or more of the sensor mesh attributes and the layout geometry of sensors 202, 204 for a particular set of display inputs 2130. The design engine 2102 may determine the sensor mesh attributes and the layout geometry of sensors 202, 204 having a resultant sensor reflectance or transmittance and sensor conductor density. Alternatively one or both of the sensor reflectance or transmittance and sensor conductor density may be provide to the design engine 2102 as a sensor input 2130, so that the design engine 2102 provides the desired visual and performance characteristics for the outputted sensor mesh attributes and the layout geometry of sensors 202, 204.

Thus, input device having a plurality of low-visibility sensor electrodes and method for fabricating the same are provided. The traces and/or sensor electrodes are arranged in a manner for minimum pattern perceptibility. In some embodiment, the traces may be electrically connected to one another to form macroscopic (e.g., a single larger) sensor element which, by virtue of the configuration of the attributes of traces and/or occluding material utilized to form the sensor element, can be configured in virtually any arbitrary shape, size or orientation while not detrimentally affecting the visibility of an image displayed on the display device adjacent the sensing region.

What is claimed is:

1. An input device comprising:
   a display device having an array of pixels, each pixel comprising at least a first subpixel having a first color and a second subpixel having a second color that is different than the first color; and
   a plurality of sensor electrodes disposed over the display device and configured to sense objects in a sensing region of the input device, wherein at least a first sensor electrode of the plurality of sensor electrodes further comprises:
      a plurality of spaced apart conductive traces forming a conductive mesh, wherein mesh having a first periodicity defined by intersections of the conductive traces forming the mesh;
      a terminal portion of one of the conductive traces terminating at an edge of the first sensor electrode has an orientation that is different than an orientation of a corresponding portion of the mesh defining the first periodicity; and wherein
      a terminal end of the terminal portion of the conductive trace proximate the edge of the first sensor electrode laying over a subpixel having the same color as a subpixel which the terminal end would lay over when the terminal portion had the same orientation as the corresponding portion of the mesh defining the first periodicity.

2. The input device of claim 1, wherein the terminal end ends at an intersection with another trace.

3. The input device of claim 1, wherein the terminal end lays over the same subpixel which the terminal end would lay over when the terminal portion had the same orientation as the corresponding portion of the mesh defining the first periodicity.

4. The input device of claim 1, wherein the terminal end lays over a different pixel which the terminal end would lay over when the terminal portion had the same orientation as the corresponding portion of the mesh defining the first periodicity.

5. The input device of claim 1, wherein an orientation of terminal end does not change mesh density for a unit cell comprising the terminal end relative to mesh density of an equally sized unit cell comprising a portion of the mesh defining the periodicity of the mesh.

6. The input device of claim 1 further comprising:
   a second sensor electrode having a mesh of same periodicity as the mesh of the first sensor electrode.

7. The input device of claim 6, wherein mesh density of a unit cell comprising adjacent portions of the first and second sensor electrodes is substantially equal to mesh density of an equally sized unit cell comprising only portion of the first and second sensor electrodes.

8. The input device of claim 6, wherein mesh density of a unit cell comprising at least one routing trace coupled to the first sensor electrode is substantially equal to mesh density of an equally sized unit cell comprising only portion of the first and second sensor electrodes.

9. The input device of claim 6, wherein mesh density of a unit cell comprising at least one routing trace coupled to the first sensor electrode is substantially equal to mesh density of an equally sized unit cell comprising adjacent portions of the first and second sensor electrodes.

10. The input device of claim 1, wherein the conductive traces forming the mesh have a diameter less than about 10 um.

11. The input device of claim 10, wherein the conductive traces forming the mesh form a moiré pattern with the display device, wherein the moiré pattern comprises a spatial frequency greater than about 10 cycles per centimeter.

12. The input device of claim 1 further comprising:
    a density compensating feature fabricated from the same material forming the conductive traces, the density compensating feature disposed adjacent an intersection between two conductive traces, the density compensating feature having an area substantially equal to an area of the intersection limited by widths of the traces.

13. The input device of claim 12, wherein the density compensating feature formed on a layer different than a layer comprising the first sensor electrode.

14. The input device of claim 12, wherein the density compensating feature is isolated from at least one of the traces.

15. The input device of claim 12, wherein the density compensating feature is electrically coupled to at least one of the traces.

16. The input device of claim 15, wherein the density compensating feature fills at least one vertices formed by the intersection of the traces.

17. The input device of claim 1 further comprising:
    a second sensor electrode having a mesh of same periodicity as the mesh of the first sensor electrode, the first and second sensor electrodes residing in different layers of the input device.

18. The input device of claim 17, wherein mesh density of a unit cell comprising adjacent portions of the first and second sensor electrodes is substantially equal to a density of an equally sized unit cell comprising only portion of one of the first and second sensor electrodes.

19. The input device of claim 17, wherein mesh density of a unit cell comprising at least one routing trace coupled to the first sensor electrode is substantially equal to mesh density of an equally sized unit cell comprising only portion of one of the first and second sensor electrodes.

20. The input device of claim 17, wherein mesh density of a unit cell comprising at least one routing trace coupled to the first sensor electrode is substantially equal to mesh density of an equally sized unit cell comprising adjacent portions of the first and second sensor electrodes.

21. An input device comprising:
    a display device having an array of pixels; and
    a plurality of sensor electrodes disposed over the display device and configured to sense objects in a sensing region of the input device, wherein the plurality of sensor electrodes further comprises:
       a first sensor electrode comprising a plurality of spaced apart conductive traces forming a conductive mesh;
       a second sensor electrode comprising a plurality of spaced apart conductive traces forming a conductive mesh;
       a first unit area having a plan area greater than about 0.0073 mm$^2$ defined within the first sensor electrode; and
       a second unit area having a plan area greater than about 0.0073 mm$^2$ defined partially within the first sensor electrode and partially within the second sensor electrode, wherein a first blockage area defined within the first unit area is substantially equal to a second blockage area defined within the second unit area.

22. A method for making a sensor device, the method comprising:

receiving display information;

generating mesh sensor fabrication instructions for creating a trace pattern for a plurality of sensor electrodes, the trace pattern having at least one of:

(A) a first unit area having a plan area greater than about 0.0073 mm² defined within a first sensor electrode of the plurality of sensor electrodes, and a second unit area having a plan area greater than about 0.0073 mm² defined partially within the first sensor electrode and partially within a second sensor electrode of the plurality of sensor electrodes, wherein a first blockage area defined within the first unit area is substantially equal to a second blockage area defined within the second unit area; and (B) a conductive mesh having a first periodicity defined by intersections of the traces forming the mesh, a terminal portion of one of the conductive traces terminating at an edge of the a sensor electrode of the plurality of sensor electrodes, the sensor electrode having an orientation that is different than an orientation of a corresponding portion of the conductive mesh, and wherein a terminal end of a terminal portion of the conductive trace proximate an edge of the sensor electrode laying over a subpixel having the same color as a subpixel which the terminal end would lay over when the terminal portion had the same orientation as a corresponding portion of the conductive mesh at an interior of the sensor electrode.

* * * * *